United States Patent [19]

Kawata et al.

[11] Patent Number: 5,063,294
[45] Date of Patent: Nov. 5, 1991

[54] CONVERGED ION BEAM APPARATUS

[75] Inventors: Yutaka Kawata; Ken-ichi Inoue; Kiyotaka Ishibashi; Akira Kobayashi, all of Kobe; Koji Inoue, Tokyo; Norio Suzuki; Akio Arai, both of Kobe; Kaneo Yamada, Akashi; Keizo Tokushige, Matsubara; Hirofumi Fukuyama, Kobe; Shigeto Adachi, Kobe; Yukito Furukawa, Kobe; Sunao Takahashi, Kobe; Makoto Kimura, Kobe, all of Japan

[73] Assignee: Kabushiki Kaisha Kobe Seiko Sho, Kobe, Japan

[21] Appl. No.: 524,432

[22] Filed: May 17, 1990

[30] Foreign Application Priority Data

| May 17, 1989 | [JP] | Japan | 1-125373 |
| Aug. 8, 1989 | [JP] | Japan | 1-206457 |
| Nov. 20, 1989 | [JP] | Japan | 1-302392 |
| Jan. 11, 1990 | [JP] | Japan | 2-4841 |
| Jan. 22, 1990 | [JP] | Japan | 2-13284 |
| Mar. 7, 1990 | [JP] | Japan | 2-57501 |

[51] Int. Cl.$^5$ .......................... G01W 23/00
[52] U.S. Cl. .................. 250/309; 250/397; 250/505.1; 250/492.2
[58] Field of Search ........... 250/309, 306, 307, 397, 250/505.1, 492.21

[56] References Cited

U.S. PATENT DOCUMENTS

| 3,585,397 | 6/1971 | Brewer | 250/298 |
| 3,909,305 | 9/1975 | Boroffka et al. | 250/492.21 |
| 4,053,808 | 10/1977 | Peacock | 250/505.1 |
| 4,550,258 | 10/1985 | Omata et al. | 250/505.1 |
| 4,697,086 | 9/1987 | Ishitomi et al. | 250/396 R |
| 4,755,685 | 7/1988 | Kawanami et al. | 250/369 ML |
| 4,894,549 | 1/1990 | Stengl | 250/281 |
| 4,954,705 | 9/1990 | Brummer et al. | 250/309 |

Primary Examiner—Bruce C. Anderson
Attorney, Agent, or Firm—Oblon, Spivak, McClelland, Maier & Neustadt

[57] ABSTRACT

A converged ion beam apparatus wherein a very small beam spot can be formed with a high energy ion beam after passing a reduced route in which a type of the ion beam is classified. The device is incorporated in an apparatus wherein an ion beam from an accelerator is introduced in a spot to a specimen by way of an ion type classifying device, an objective collimator and a beam collector to perform reforming of a surface or an analysis of physical properties and/or composition or the like of a small area of the specimen. The objective collimator is disposed just on the downstream of the accelerator, and an analyzing component for analyzing an ion type and energy of a beam is interposed in a drift space in an object distance between the objective collimator and a quadruple pole magnetic lens. Several components of the apparatus are also improved including the quadruple pole magnetic lens, an objective slit device and a specimen chamber.

19 Claims, 17 Drawing Sheets

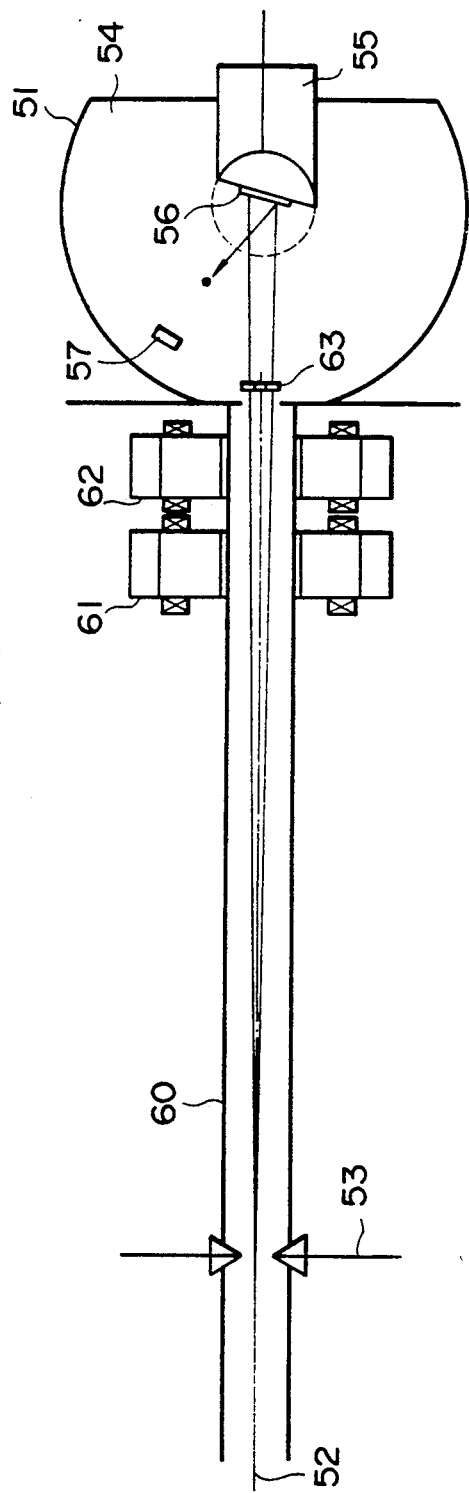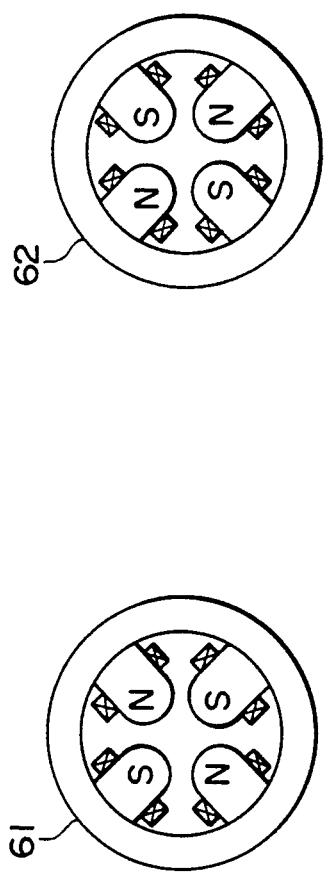

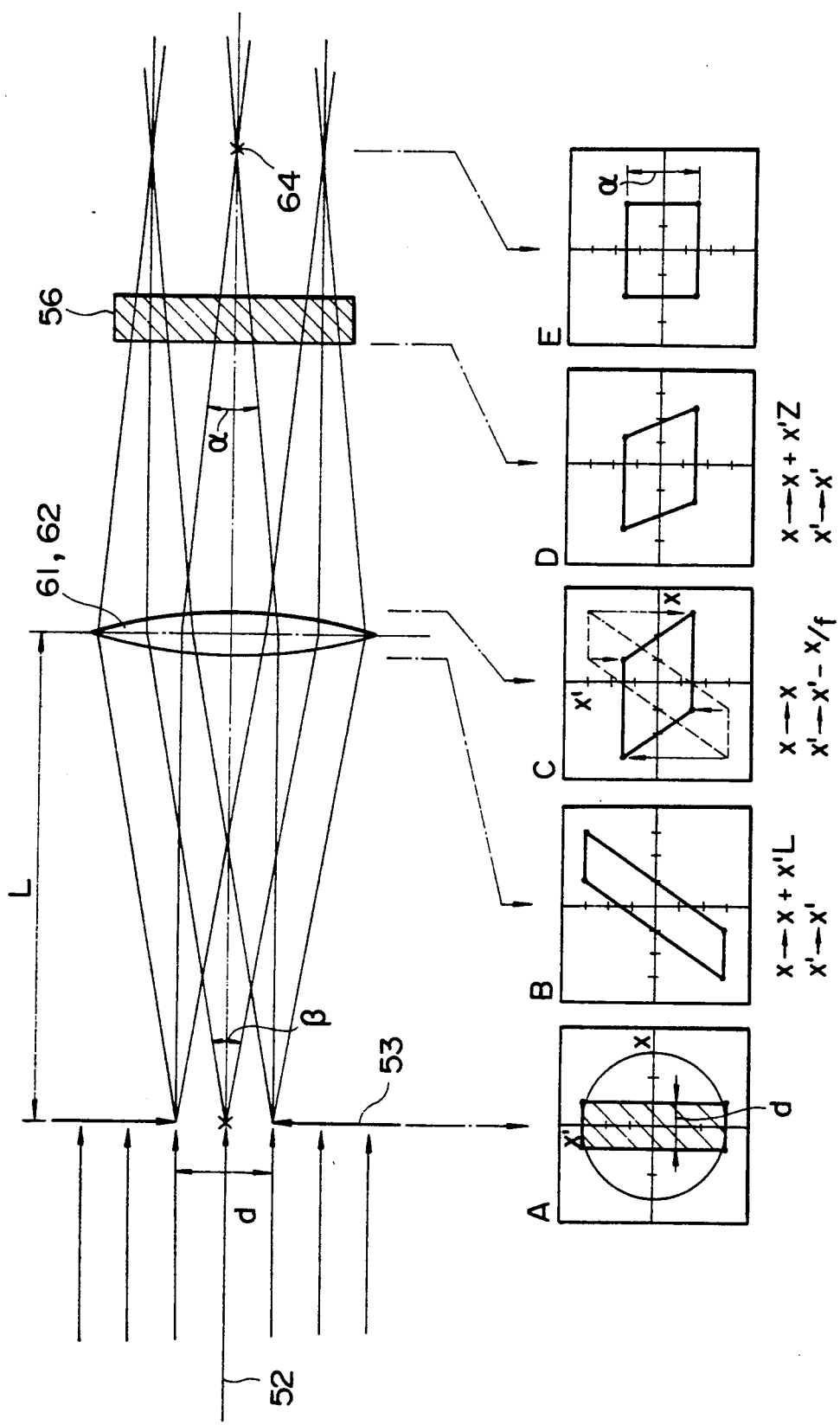

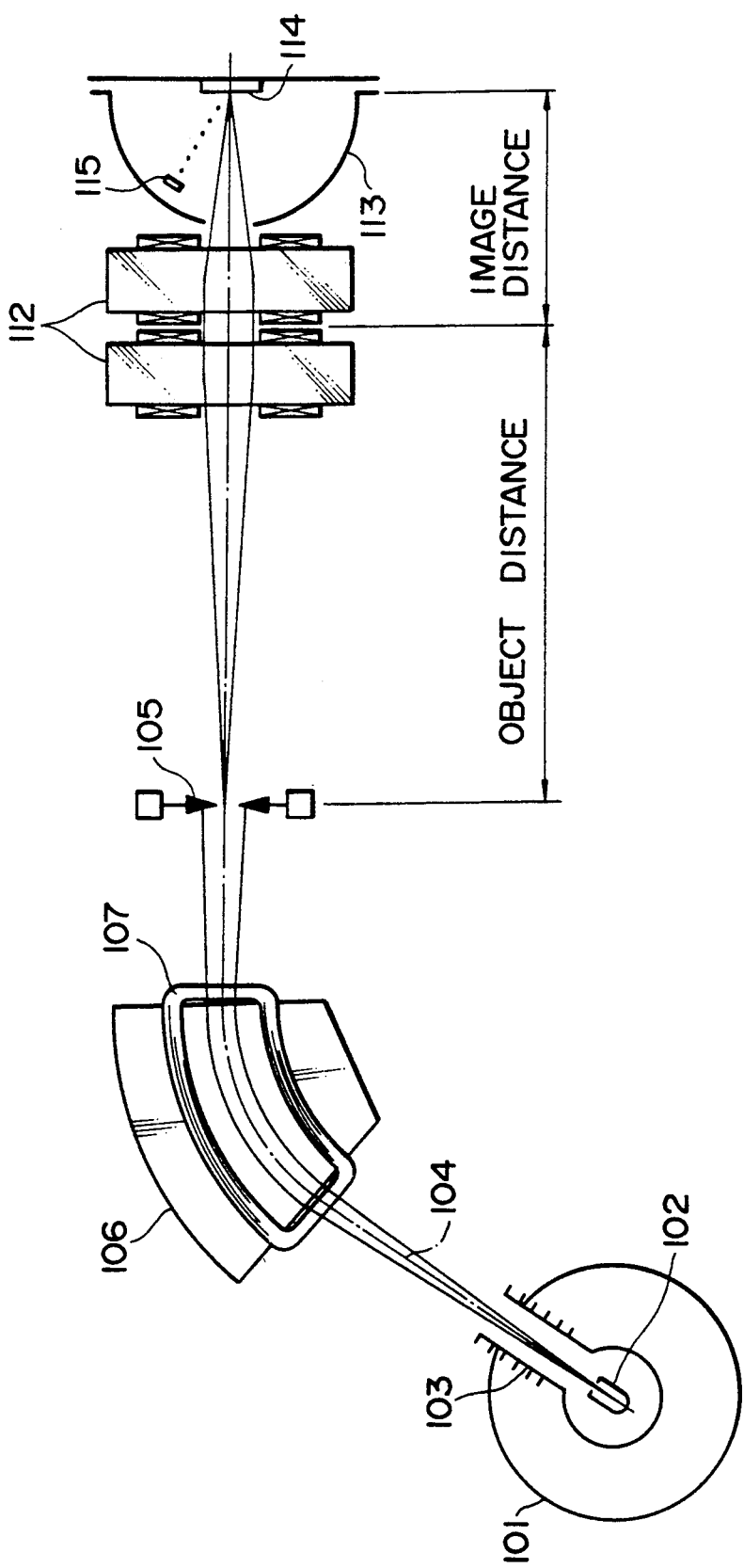

CONVERGED ION BEAM APPARATUS

BACKGROUND OF THE INVENTION

1. Field of the Invention

This invention relates to an apparatus for analyzing physical properties and/or composition of a small area of a specimen, for finely working a specimen or for reforming a surface of a specimen using a high energy charge beam such as an ion beam in various industrial fields including the technical field of semiconductors, the medical and biological technical fields and so forth, and also to various components of such an apparatus including a device for analyzing a crystal structure of a specimen, a quadruple pole magnetic lens, an objective slit device and a specimen chamber.

2. Description of the Prior Art

In the technical field of semiconductors, increase of the storage capacity and increase of the information processing speed are demanded in order to process a large amount of information on a computer. To this end, development of high integration of ICs has been directed from LSIs to VLSIs and further to three dimensional ICs. As such development proceeds, individual elements and wires for those elements are remarkably reduced in size and increased in layers and besides use of a very shallow region under a surface is proceeding. In such investigation of ICs and processes, an ion beam converged to a microscopic size makes a very effective means. For example, in production, maskless implantation is made possible and the production process can be simplified significantly using a converged ion beam accelerated to several hundreds eV to several MeV. On the other hand, in analysis, an analysis of an atom distribution in a microscopic area is very important, and to this end, the effectiveness of an analyzing technique such as the Rutherford backscattering method (RBS) or the particle exciting X-ray spectroscopic method (PIXE) which uses a converged ion beam of a high energy (MeV) and has a resolution smaller than 1 μm is recognized. Thus, improvement in function of such apparatus is being proceeded.

FIG. 16 illustrates an exemplary one of a high energy converged ion beam apparatus which is used as an analyzing apparatus. Referring to FIG. 16, a high energy ion beam 104 generated from an ion source 102 of an accelerator 101 and accelerated by an accelerator tube 103 is first deflected, while passing through a deflecting analyzing electromagnet 106 having a coil 107, by an angle normally greater than 15 degrees so that it is classified in ion type and energy. Subsequently, the high energy ion beam 104 is restricted to several tens μm by an objective collimator or slit member 105 and then, after passing a drift space of 2 to 5 m, introduced into and converged by two or three series of quadruple pole magnetic lenses 112 so that it forms a beam spot on a target 114 accommodated in a specimen chamber 113, that is, on a specimen to be measured. A detector 115 detects ions or an excited X-ray radiated from the target 114.

The distance of a drift space from the objective collimator 105 to the quadruple pole magnetic lenses 112 is called an object distance while the distance from the lenses 112 to the target 114 is called an image distance, and the present optical system has a function of converging an aperture of the objective collimator 105 at a rate of reduction substantially equal to a rate between the two distances and irradiating the thus converged aperture upon the target 114. By the way, since the image distance is 100 to 200 mm or so because an accommodation spacing for the detector 115 and so forth is required, in order to make a beam spot further smaller and/or to further raise the current density to achieve improvement of performances of the system, the object distance must be further increased.

In the conventional converged ion beam apparatus described above, a route of a beam including the distance from the accelerator 101 to the deflecting analyzing electromagnet 106 and the distance from the electromagnet 106 to the specimen chamber 113 requires at least 7 m or more. Besides, since the deflecting angle of an ion beam is greater than 15 degrees in order to classify a type of ions by means of the deflecting analyzing electromagnet 106, an ion beam is expanded also in a lateral direction, an in an actual arrangement, a spacing greater than about 7 m × 3 m is required, which makes, rather than an apparatus, an equipment having such a horizontal extent that may fully occupy a room.

Besides, reverse disadvantages are caused by an increase in size of an apparatus, and in particular, in order to converge an ion beam to a spot size of about 1 μm, it is necessary to perform initial adjustment strictly and, further as a maintaining operation, precisely maintain alignment of the optical system wherein centers and axial lines of individual components are made coinncide with each other. In this instance, an alignment adjusting operation between components disposed along a beam line which is deflected by an angle greater than 15 degrees is further difficult. Further, since the apparatus is great in size, integration of a platform for the prevention of vibrations is almost impossible.

Meanwhile, in order to converge an ion beam of a high energy (MeV) with such a conventional converged ion beam apparatus, a strong lens system is required which is higher by 1,000 times in resolution compared with an ordinary electron microscope. To this end, utilization is considered of a nonaxisymmetic lens such as a quadruple pole lens (for example, Nuclear Instrument and Methods 197 (1982), pp. 65–77).

FIG. 17 shows a magnetic pole body of an exemplary one of conventional quadruple pole lenses. Referring to FIG. 17, the magnetic pole body includes a cylindrical return yoke 124 and four magnetic poles 123 secured to the cylindrical return yoke 124 by means of fastening bolts 125. The magnetic pole body is shown in a disassembled condition in FIG. 18.

Generally, the converging force k of an ion beam by a quadruple pole lens is represented as $$k \propto \left(\frac{e}{EM}\right)^{\frac{1}{2}} (NI)^{\frac{1}{2}} \cdot \frac{1}{r_B}$$

where e is charge of ions, E beam energy, M a mass of ions, N a number of coils of a winding, I a coil current, and $r_B$ a bore diameter. The converging force k thus increases in inverse proportion to the bore diameter $r_B$, that is, to a radius of an inscribed circle to such four magnetic poles shown in FIG. 17. Accordingly, a very strong converging force is obtained as the bore radius is decreased.

Recently, the necessity has arisen for a quadruple pole magnetic lens having a high degree of accuracy and a strong converging force and having a bore radius smaller than 3 mm for the object of formation or the like of a microscopic ion beam of high energy, but a bore radius greater than 10 mm is a common limit with such conventional structure as shown in FIG. 17.

The following problems reside in obtaining a very small bore radius comparing with a radius of a return yoke in order to obtain a very strong converging force of an ion beam with regard to a quadruple pole lens. In particular, with the conventional structure of FIG. 17, if it is attempted to only make the bore radius smaller than 3 mm while the return yoke radius is left to be, for example, greater than 150 mm from the necessity to provide a sufficient magnetomotive force, that is, a sufficient coil sectional area, then each magnetic pole will have a radially elongated configuration. Consequently, the accuracy in position of the magnetic poles will rely delicately upon an accuracy in assembly thereof to the return yoke, and accordingly, it is difficult from the accuracy in structure to assure a predetermined relational accuracy or tolerance of the magnetic poles (smaller than $\pm 1$ $\mu$m in a radial direction, and smaller than 0.01 degree in relative angle).

Accordingly, with the conventional structure, the accuracy in arrangement of the magnetic poles is so low that the magnetic field distribution is displaced from a hyperbolic distribution and the aberration is increased, and it is difficult to form a fine spot of a beam. For example, in an optical system wherein a microscopic beam of 1 $\mu$m is obtained using a lens having a bore radius, for example, of 2.5 mm, displacement of an end of a magnetic pole only by several $\mu$m will cause blurring of a beam spot by an amount greater than several $\mu$m.

By the way, in order to obtain a diameter of 1 $\mu$m as a minimum beam spot with such a conventional converged ion beam apparatus described hereinabove with reference to FIG. 16, since the reduction rate normally ranges substantially from 1/5 to 1/30, it is necessary to converge a beam to the diameter of 5 to 30 $\mu$m by means of the objective slit member or collimator 105, and 1 $\mu$m is required for the tolerance in movement of an edge of the slit member.

As a conventional slit device, it is convenient to use a plate in which a small hole through which a beam is to pass is perforated. However, it is impossible to change the diameter of a beam with the slit plate. In applications for a local analysis or fine working of a small area, generally it is sometimes necessary to arbitrarily change the size of a beam spot. Accordingly, a mechanism is employed wherein wedge-shaped knife edge members or cylindrical edge members of metal are opposed from four directions to each other such that the shape of a beam passing therethrough is controlled by a change of the shape of the slit defined by those edge members. In a certain conventional slit device, a wedge-shaped edge member is mounted at an end of each of precision driving mechanism sections such as micrometer heads, and an opening width of a slit defined by the edge members is estimated from graduations of the micrometer heads of the individual edges.

FIG. 19a illustrates, in front elevation, an exemplary one of conventional slit devices having electrically driven adjusting mechanism sections employing piezoelectric elements in place of micrometer heads. Either a pair of knife-shaped edge members 131 or such a pair of wedge-shaped edge members 131' as shown in a vertical sectional side elevational view of FIG. 19b are mounted in an opposing relationship at free ends of arms 133 individually supported on a vacuum duct wall 134 by means of flexible joints 148, and voltages to be applied to piezoelectric elements 149 located behind the edge members 131 are adjusted so as to set a width of a slit between the wedge-shaped edge members 131 through which an ion beam is to pass along a beam line BL as indicated by an arrow mark in FIG. 19b.

In the conventional slit device described above, when it is intended to completely close the slit to find out a zero position at which the opening width of the slit is equal to zero, since there is a local gap between edges of the slit even in a condition wherein the edges contact with each other due to an imperfection in flatness of surfaces of the wedge-shaped or cylindrical edge members (it is inevitable from the point of accuracy in working that an unevenness or an inclination of $\mu$m or so exists), an ion beam will leak by way of the local gap, and consequently, the zero point cannot be determined precisely. If the zero point cannot be determined, then it is impossible to set the slit opening width on the order of $\mu$m with a high degree of accuracy. Meanwhile, if an operation is performed to compulsorily contact the edges with each other so as to assure a perfectly closed condition, then an excessive load is applied to ends of the edges or to the high precision driving mechanism sections, which makes a cause of deformation at an end of an edge or play of the driving mechanism sections. After all, the conventional slit device cannot achieve satisfactory determination of a zero point in practical use. Accordingly, the setting and control of an opening width of a slit with a required degree of accuracy is impossible.

Further, the amount of heat generated by that part of an ion beam which collides with ends of the edges of the slit is estimated to be several W or more. Since the edge members are placed in a vacuum, such heat is all transmitted to arms or posts on which the edge members are supported. In the conventional slit device, since wedge-shaped or cylindrical edge members are supported on arms and/or posts, the variation of the opening width of the slit which is caused by thermal expansion at the elements presents an unignorable amount. In fact, in the conventional slit device, a current variation of an ion beam arising from such variation on the order of several to several tens $\mu$m is observed during use of the device.

In addition, in the conventional slit device, since such a mechanism is employed that two opposing edge members are operated independently of each other to set the opening width of the slit, two times of operation for the opposite sides are required in order to set an arbitrary slit opening width while keeping the center of the slit fixed. Also when it is intended to set the center position of the slit while keeping the opening width of the slit fixed in order to adjust axes of a beam and an optical system, two times of operation for the opposite sides are required. Accordingly, the operability is low in a similar manner.

On the other hand, a conventional channeling measuring beam line which may be employed in such a conventional converged ion beam apparatus as described hereinabove with reference to FIG. 16 normally has such an arrangement as shown in FIG. 20. Referring to FIG. 20, a beam 152 of charged particles such as protons or helium ions generated from an accelerator (not shown) of several MeV of the Van de Graaff type is collimated to a spread angle of 0.01 degrees or so by two upstream and downstream slit devices 153 and 150 and irradiated upon a specimen 156 such as a specimen of single crystal on a biaxial goniometer 155. Ions backscattered from the specimen 156 are normally detected by a semiconductor detector 157 of the silicon surface barrier type and then amplified by an amplifier 158 outside the tank 151, whereafter they are analyzed in energy by a multichannel pulse-height analyzer 159.

The performance of the channeling measurement by the two slit devices 153 and 150 can be geometrically led out from a diagrammatic view of FIG. 21. First, parameters are defined in the following manner.

$\alpha$: maximum spread angle (divergence angle) of a beam irradiated upon a surface of a specimen 156

$\beta$: maximum spread angle (divergence angle) of an incident beam $d_1$: opening of the upstream slit device 153

$d_2$: opening of the downstream slit device 150

$L'$: distance between the upstream and downstream slit devices 153 and 150

When the downstream slit device 150 satisfies a condition $2L'\beta > d_2$ in which it operates effectively, the spread angle $\alpha$ defined by the two slit devices 153 and 150 is equal to an angle which is provided by two alternate long and short dash lines in FIG. 21 which interconnect opposing edges of the upstream and downstream slit devices 153 and 150 and is given by the following expression.

$$\alpha = \frac{(d_1/2 + d_2/2)}{L'} \times 2 = \frac{(d_1 + d_2)}{L'}$$

Since the apertures of the upstream and downstream slit devices appear in the form of a sum as a numerator in the expression above, it can be recognized that it is necessary to reduce the opening widths of the two slits equally to each other in order to raise the parallelism of a beam. By placing $d_1 = d_2 \sim \bar{d}$, $$\alpha \sim \frac{\bar{d}}{L'/2}$$

Meanwhile, a ratio $\eta$ of those of ions passing through the upstream slit device 153 which pass through the downstream slit device 150 is, if it is evaluated approximately that ions are distributed uniformly in a divergent cone, given by $$\eta = \left(\frac{d_2/2}{d_1/2 + \beta L'/2}\right)^2 = \left(\frac{d_2}{d_1 + \beta L'}\right)^2 \propto \bar{d}^2$$

In particular, it can be seen that, while the spread angle $\alpha$ decreases in proportion as $\bar{d}$ decreases, the ion current decreases in proportion to a square of $\bar{d}$.

Particularly, if ordinary parameter values $\beta = 1$ mrad (0.06 degrees), $d_1 = d_2$ 1 mm and $L' = 3$ m are substituted into the expressions above, then $\alpha = 0.7$ mrad (0.04 degrees) and $\eta = 0.063$ (6.3%) are obtained.

Manners of cutting of a beam by the upstream and downstream slit devices 153 and 150 in a phase space are represented as shown in lower phase views A' to D' of FIG. 21.

If it is assumed that an incident beam has a circular emittance in a phase space, it is cut to a vertically elongated shape by the upstream slit device 153 (view A'). Then, while the incident beam advances in a drift space of the length $L'$, it is deformed in accordance with conversions of $x \rightarrow x + x'L'$ and $x' \rightarrow x'$ (view B'), and then it is cut by the downstream slit device 150 so that it may have a further reduced spread angle $\alpha$ (view C').

Thus, the beam presents such a shape as seen in the view D' at a surface of a specimen 156. Accordingly, it can be recognized that also in a phase space, as the drift space increases, the spread angle of a beam cut by the downstream slit device decreases.

Such a conventional double slit system has the following fundmental problems as can be recognized from the analysis described above.

While it is necessary either to reduce both of the apertures of the two slit devices or to increase the distance between the two slit devices in order to raise the parallelism of an ion beam to be irradiated, an irradiation ion current is sacrificed in either case. In particular, since the cutting efficiency of an incident ion beam is low, it can be utilized only at a low rate as an irradiation ion current. Accordingly, if a practical measurement is made possible, then it cannot be anticipated to improve the performance further than actual results at present.

Anyway, the conventional double slit system requires assurance of a long beam line by all means, which makes construction of an apparatus difficult in various respects.

Where such a conventional converged ion beam apparatus as described hereinabove with reference to FIG. 16 is used as an ion beam analyzing apparatus, ions, electrons, photons and so forth which are radiated from a surface of a specimen 114 by irradiation of an ion beam 104 upon the specimen 114 are detected by the detector 115 in the specimen chamber 113 to analyze a type, energy, and angle and so forth of the radiated particles in order to obtain atom distribution information at a position very near to the surface of the specimen 114 or in a zone from the surface to the inside of the specimen 114.

Then, in those ion beam analyzing apparatus, radiated ions are detected in accordance with the RBS method but a characteristic X-ray is detected in accordance with the PIXE method to make a measurement and an analysis. However, an object and a range of such analysis vary depending upon a type of an ion beam used.

In particular, in accordance with the random RBS method wherein backscattered ions from ions incident in an arbitrary direction except for to crystal axes of a specimen, a conventional ion beam having a diameter on the order of mm (hereinafter referred to simply as a large diameter beam) is used to effect a measurement of a thickness of a film and/or an evaluation of an interfacial structure of a functional thin film semiconductor or the like, a non-destructive inspection of a multi-layer structure, an evaluation of an ion implanting and diffusing process and so forth. On the other hand, a microscopic ion beam (hereinafter referred to simply as a small diameter beam) is used to effect a verification of maskless ion implanting process conditions of a functional thin film semiconductor or the like, diagnostics of a wafer after fine working, and a migration evaluation of a multi-layer wiring structure. In the meantime, in accordance with the channelling RBS method wherein backscattered ions of a large diameter parallel beam incident in parallel to a crystal axis of a specimen are measured, crystalline evaluation after etching of a crystalline thin film of an electronic material or the like, crystalline restoration of a crystalline thin film by annealing, determination of a crystal structure of a ceramic superconducting thin film, evaluation of lattice defects of a crystal surface and so forth are effected.

Further, in accordance with the PIXE method wherein a characteristic X-ray emitted from a specimen upon irradiation of ions is measured, a large diameter beam is used, and a quantitative analysis of environmental pollution elements in dust in environmental analysis, quantitative evaluation of specific trace elements in a biological structure in medical analysis or the like, identification of an age in archaeological analysis or the like and so forth are effected. Meanwhile, a small diameter beam is used when measurement of a distribution of a trace element in a cell in biological analysis or the like, chronological quantitative evaluation of environmental pollution elements contained in hair, a shell or an annual ring of a tree in environmental analysis or the like, quantitative evaluation of a trace element composition in a morbid cell in medical analysis and so forth are effected.

In this manner, an ion beam analyzing apparatus can make various measurements and analyses of a wide range depending upon the type of an ion beam used.

Therefore, investigations have been made from various aspects of system construction which can use a plurality of types of ion beams on the same apparatus, and such a multipurpose ion analyzing equipment as, for example, shown in FIG. 22 has been invented and put into practical use. The analyzing equipment is constituted such that an ion beam of a high energy emitted from an accelerator 271 is classified in ion type and energy by an ion deflecting electromagnet 272 such that ion beams are bent in three different directions and distributed to three analyzing lines 273, 274 and 275 in order that they may be used for various analyses corresponding to the characteristics thereof. Further, the ion beams distributed to the individual analyzing lines are changed into beams having predetermined forms and diameters by objective collimators and electromagnetic lenses disposed along the analyzing lines and are then introduced into specimen chambers 276, 277 and 278 disposed at terminal end portions of the individual analyzing lines 273, 274 and 275 and having individually different constructions.

In the conventional multipurpose ion analyzing equipment described above, such a construction is employed so that an analysis in accordance with the random RBS method or PIXE method which uses a small diameter beam is made on the first analyzing line 273; an analysis in accordance with the channelling RBS method which uses a parallel large diameter beam is made on the second analyzing line 274; and an analysis in accordance with the random RBS method or PIXE method which employs a large diameter beam is made on the third analyzing line 275 so that the ion analyzing equipment may cope with various analyses of a wide range with the entire system.

In an ion analyzing apparatus, if the type of an ion beam to be used can be changed variously, then it is possible to make various analyses of a wide range as described above. However, where such a conventional ion analyzing apparatus as shown in FIG. 16 is used, since the apparatus is of the type having a single function which naturally uses an ion beam of a predetermined type, that is, since the type of ions is selected by deflecting a beam emitted from an accelerator to a particular angular direction by means of a deflecting analyzing electromagnet so that an ion beam of a particular type is irradiated along a particular irradiation line upon a target, the ion analyzing apparatus can only cope with an analysis of a limited type. Therefore, such a construction is employed that, as in the conventional multipurpose ion analyzing equipment described hereinabove with reference to FIG. 22, a beam from an accelerator is selected in ion type and energy by means of an ion deflecting electromagnet such that ion beams having individually different characteristics are distributed to a plurality of analyzing lines and used for various analyses for various applications. In this instance, however, while the ion analyzing equipment can cope with various analyses of a wide range, the individual analyzing lines following the ion deflecting electromagnet must be constructed in different manners in accordance with the individual objects, and in addition to the fact that the apparatus is increased in size, the individual analyzing lines expand at individually different angles. Accordingly, there is a problem in that an increase in apparatus cost and installation spacing is invited.

Thus, the inventors have made various investigations to obtain an ion beam analyzing apparatus of a compact construction which eliminates such problems of the conventional ion beam analyzing apparatus described above and can make various analyses. As a result, a conclusion has been drawn that, in order to attain the object, it is most effective (1) to changeably select an ion beam of a particular type and permit the same to be irradiated along a same beam irradiation axial line upon a target and (2) to introduce ion beams of various types to be irradiated along the same beam irradiation axial line into a same specimen chamber so as to enable the ion beams of the various types having different characteristics to be selectively used to make various analyses.

Then, various investigations have been made to put them into practice. As a result, it has been found out that the subject (1) to changeably select an ion beam of a particular type and permit the same to be irradiated along the same beam irradiation axial line upon a target can be realized if such a construction that an objective collimator is disposed just on the downstream of an accelerator while an ion type and energy analyzing component (for example, a Wien (E×B) type mass spectrograph) is disposed between the objective collimator and an electromagnet lens, is employed. However, a specimen chamber of a construction which selectively introduces ion beams of various types to be irradiated along a same beam irradiation axial line and can make an analysis selectively using the ion beams of various types having different characteristics is still unknown, and a specimen chamber of a new construction which achieves the object is required.

SUMMARY OF THE INVENTION

It is an object of the present invention to provide a converged ion beam apparatus wherein a very small beam spot can be formed with a high energy ion beam after passing a reduced route in which a type of the ion beam is classified.

It is another object of the present invention to provide a quadruple pole lens for use with a converged ion beam apparatus which is easy to produce and wherein an arrangement of magnetic poles can be decided with a very high degree of accuracy and a magnetic field having a distribution very near to a hyperbolic magnetic field can be formed.

It is a further object of the present invention to provide an objective slit device for use with a converged ion beam apparatus wherein a slit can be closed perfectly and an opening width and/or the center of the slit can be set readily with a high degree of accuracy.

It is a still further object of the present invention to provide a parallel charge beam forming lens arrangement for use with a converged ion beam apparatus which is improved in collimation degree of an ion beam to be irradiated upon a specimen and through which an ion beam can pass in a high efficiency.

It is a yet further object of the present invention to provide a specimen chamber for use with a converged ion beam apparatus wherein ion beams of various types having different characteristics can be introduced along a same beam irradiation axial line and various analyses can be made efficiently to selectively use an ion beam of a desired type.

In order to attain the objects, according to the present invention, there is provided a converged ion beam device for an apparatus wherein a high energy charge beam in the form of an ion beam from an accelerator is introduced in a spot to a specimen by way of an ion type classifying device, an objective collimator and a beam collector to perform reforming of a surface or an analysis of physical properties and/or composition or the like of a small area of the specimen, characterized in that the objective collimator is disposed just on the downstream of the accelerator, and an analyzing component for analyzing an ion type and/or energy of a beam is interposed in a drift space in an object distance between the objective collimator and a quadruple pole magnetic lens.

With the converged ion beam device, since the analyzing component for analyzing an ion type and/or energy of a beam is interposed in the drift space in the object distance between the objective collimator and the quadruple pole magnetic lens, the overall size of the device can be reduced by 40% or more, and compacting of the device can be achieved. Since the device can be made compact, a platform for mounting the device can be provided in an integral relationship with the device, which facilitates precision alignment of the components and improves the vibration preventing performance. Consequently, a minimum beam spot to be formed on a specimen or target can be reduced further.

A mass spectrograph of the Wien (E×B) type may be used as the analyzing component. Where a Wien (E×B) type mass spectrograph is employed, the beam line extends rectilinearly, which further facilitates aligning operation of the components. Further, since a deflecting electrode of a Wien (E×B) type mass spectrograph can act also as a kind of a steerer, it can be utilized for the fine adjustment of alignment of a beam in the quadruple pole magnetic lens and also for the scanning of a beam spot on a specimen to be measured. Alternatively, either one of a deflecting electromagnet or a deflecting electrode for deflecting a charge beam by 45 degrees to 180 degrees may used as the analyzing component.

According to another aspect of the present invention, there is provided a converged ion beam analyzing apparatus wherein a high energy charge beam from an accelerator is introduced in a spot to a specimen to be measured by way of an ion type classifying device, an objective collimator and a beam collector to perform an analysis of physical properties and/or composition or the like of a small area of the specimen, characterized in that the objective collimator is disposed just on the downstream of the accelerator, and an analyzing component for analyzing an ion type and/or energy of a charge beam is interposed in a drift space in an object distance between the objective collimator and a quadruple pole magnetic lens.

With the converged ion beam analyzing apparatus, since the analyzing component for analyzing an ion type and/or energy of a beam is interposed in the drift space in the object distance between the objective collimator and the quadruple pole magnetic lens, the overall size of the apparatus can be reduced by 40% or more, and compacting of the apparatus can be achieved. Since the apparatus can be made compact, a platform for mounting the apparatus can be provided in an integral relationship with the apparatus, which facilitates precision alignment of the components and improves the vibration preventing performance. Consequently, a minimum beam spot to be formed on a specimen or target can be reduced further.

According to a further aspect of the present invention, there is provided a high precision quadruple pole magnetic lens for use with a converged ion beam device, characterized in that it includes a magnetic pole body constituted from four magnetic pole portions, and a return yoke portion disposed to surround an outer periphery of the magnetic pole portions in such a manner so as to form a closed magnetic flux passage, the magnetic pole portions and the return yoke portion being formed as a unitary member by a scooping out operation from the same magnetic material of a unitary member.

With the quadruple pole magnetic lens, since the magnetic pole body is formed as a unitary member and hence has no contacting faces between the magnetic pole portions and the return yoke portion thereof, the ends of the magnetic pole portions can be finished at relative positions with a high degree of accuracy. Besides, since the quadruple pole magnetic lens does not suffer from chronological displacement of the magnetic poles which may arise from loosening of bolts or the like which often takes place in a quadruple pole magnetic lens of a conventional structure, even if the bore diameter is very small (to 5 mm$\phi$), the quadruple pole magnetic lens can stably produce a hyperbolic magnetic field (quadruple pole magnetic field) with a high degree of accuracy.

Preferably, the scooping out operation is performed by applying a technique of electric discharge machining using a wire electrode to form a hyperbolic shape of the magnetic pole portions with a finishing tolerance on the order of $\mu$m. Since the scooping out operation makes it possible to linearly work the magnetic pole body in its axial direction, the quadruple pole magnetic lens obtained can have a uniform sectional shape along the entire axial length or thickness (40 to 60 mm) of the lens, and accordingly, the bore diameter and the relative positions of the magnetic poles can be made uniform along the entire axis length of the lens.

According to a still further aspect of the present invention, there is provided an objective slit device for use with a converged ion beam device, characterized in that it comprises a pair of slit defining members having wedge-shaped, knife-shaped or cylindrical edges disposed in an opposing relationship to each other to define a slit gap therebetween but displaced a little distance along a charge beam from each other. The objective slit device further comprises a pair of precision driving mechanisms for individually precision driving the slit defining members, and a pair of arms and/or posts individually supporting the slit defining members thereon and individually coupling the slit defining members to the precision driving mechanisms and each having a cooling water path mechanism formed therein for introducing and passing cooling water therethrough to a location proximate to the edge of a corresponding one of the slit defining members. Each of the precision driving mechanisms includes a stepping motor for driving a corresponding one of the slit defining members, and the stepping motors are controlled by an opening width controller for controlling a width of the slit gap and an opening center position controller for controlling the position of the center of the slit gap, each of the opening width controller and opening center position controller including a pulse generator.

With the objective slit device, a charged particle beam can be restricted stably with a high degree of accuracy. Particularly, since the opposing edge defining members are displaced along a path of a charge beam from each other, the slit can be closed completely with the edge defining members closed in an overlapping condition. Consequently, a zero point can be set readily with a high degree of accuracy. Further, since water can circulate in the cooling water path mechanisms of the arms or posts on which the edge defining members are supported, those portions are free from a temperature gradient, and consequently, a possible variation of the opening width of the slit can be minimized. Accordingly, the opening width does not rely upon an ion beam current and is normally held in a stabilized condition. In addition, since the slit opening width and the opening center position are controlled by separate control systems and an object of control can be achieved by a single operation, the operability is very high.

According to a yet further aspect of the present invention, there is provided a parallel charge beam forming lens device for use with a converged ion beam analyzing apparatus, characterized in that it comprises an optical system which includes a single slit device and a magnetic lens disposed on the downstream of the slit device along a beam line, and wherein the opening width of a slit of the slit device is set to a value smaller than a product of a maximum spread angle of an incident beam and a distance between the slit device and the magnetic lens, and the focal length of the magnetic lens is set substantially equal to the distance between the slit device and the magnetic lens.

With the parallel charge beam forming lens device, since an entire ion beam cut out by the slit device on the downstream side can be formed into an angular beam having a smaller spread angle and introduced to a surface of a specimen, a parallel beam forming optical system can be obtained which presents a high beam utilization efficiency. Besides, since the beam line can be reduced as much as the beam utilization efficiency is high comparing with that of a double slit system of the prior art, a beam having a high parallelism can be obtained in a reduced beam line. Besides, the aperture of the slit on the upstream can be reduced as much as the utilization efficiency is high comparing with that of a conventional double slit system having a same length, and the parallelism of an irradiation beam is improved in reverse proportion to the aperture.

According to an additional aspect of the present invention, there is provided a specimen chamber for use with a converged ion beam analyzing apparatus, characterized in that it comprises a multi-specimen positioning device disposed in the specimen chamber and having a beam admitting port for selectively admitting therethrough an ion beam having a large diameter or a small diameter along a common beam irradiation axial line, the multi-specimen positioning device being capable of carrying thereon a plurality of specimens to be analyzed by an ion beam of the large diameter and selectively positioning one of the specimens at a position on the beam irradiation axial line, and a goniometer disposed in the specimen chamber for movement to and from a position on the beam irradiation axial line between the multi-specimen positioning device and the beam admitting port and capable of carrying a specimen to be analyzed by an ion beam of the small diameter and positioning the specimen with a high degree of accuracy at a position on the beam irradiation axial line.

Since the specimen chamber for use with a converged ion beam analyzing apparatus comprises the multi-specimen positioning device disposed therein and having the beam admitting port for selectively admitting therethrough an ion beam having the large diameter or the small diameter along the common beam irradiation axial line and besides capable of carrying thereon a plurality of specimens to be analyzed by an ion beam of the large diameter and selectively positioning one of the specimens at the position on the beam irradiation axial line, a large diameter ion beam can be irradiated successively upon a plurality of specimens carried on the multi-specimen positioning device to efficiently make an analysis in accordance with the random RBS method or the PIXE method which uses an ion beam of the large diameter.

Further, since the specimen chamber comprises the goniometer disposed in the specimen chamber for movement to and from the position on the beam irradiation axial line between the multi-specimen positioning device and the beam admitting port and capable of carrying a specimen to be analyzed by an ion beam of the small diameter and positioning the specimen with a high degree of accuracy at the position on the beam irradiation axial line, a beam spot of an ion beam of the small diameter can be formed on a specimen carried on the goniometer to effect an analysis in accordance with the random RBS method or the PIXE method which uses an ion beam of the small diameter. Further, since the goniometer is disposed for movement to and from the position on the beam irradiation axial line, when a specimen carried on the multi-specimen positioning device is to be analyzed with an ion beam of the large diameter, the goniometer can be retracted from the position on the beam irradiation axial line so that the ion beam to be irradiated upon the specimen can pass by the goniometer without being obstructed by the goniometer.

An annular detector for detecting scattered ions may be disposed on the beam irradiation axial line between the goniometer and the beam admitting port so that ions scattered from a specimen can be detected with a high degree of accuracy to effect a measurement and an analysis with a higher degree of accuracy.

Preferably, the annular type detector is provided for movement to and from a position on the beam irradiation axial line and has a detecting section of a microscope carried thereon, and the specimen chamber further comprises a moving mechanism for moving the detecting section of the microscope to a specimen carried on the goniometer. Thus, a surface of a specimen after an ion beam has been irradiated upon the specimen to detect scattered ions by means of the annular type detector can be observed directly by means of the microscope, and even where the amount of an allowable irradiation beam is small as in an analysis in accordance with the RBS method which uses an ion beam of the small diameter, the accuracy in measurement and analysis can be made surer by detection and observation by means of the annular type detector and the microscope.

The specimen chamber may further comprise a load locking chamber provided in a communicating relationship in the specimen chamber which is capable of deaerating the inside thereof independently of the specimen chamber, a gate valve interposed between the load locking chamber and the specimen chamber, and a specimen loading/unloading mechanism provided for movement between the inside of the load locking chamber and the goniometer with a specimen carried thereon which is to be analyzed with an ion beam of the small diameter to load or unload the specimen onto or from the goniometer. Thus, a specimen on the goniometer can be replaced while maintaining a vacuum or decompressed condition of the specimen chamber. Consequently, an analysis with an ion beam of the small diameter can be performed successively and efficiently.

Preferably, the goniometer is capable of carrying thereon also a specimen to be analyzed with an ion beam of the large diameter and has a specimen carrying face which is tiltable around a point at which the specimen carrying face intersects with the beam irradiation axial line. Thus, the incidence angle of a beam to a specimen carried on the goniometer can be adjusted readily, and an analysis in accordance with the channeling RBS/PIXE method which uses a parallel beam of the large diameter can be made certainly and efficiently.

It is to be noted that an ion beam of the large diameter described above is a conventional ion beam having a diameter on the order of mm while an ion beam of the small diameter is a microscopic ion beam which is converged to a diameter on the order of $\mu$m.

The above and other objects, features and advantages of the present invention will become apparent from the following description and the appended claims, taken in conjunction with the accompanying drawings in which like parts are denoted by like reference characters all through the drawings.

BRIEF DESCRIPTION OF THE DRAWINGS

FIG. 8 is a schematic view showing an optical system of a parallel charge beam forming lens device which may be incorporated in the converged ion beam apparatus of FIG. 1;

FIGS. 9a and 9b are front elevational views of two quadruple pole magnetic lenses of the optical system of FIG. 8;

FIG. 10 is a diagrammatic representation showing, at an upper portion thereof, geometrical light paths where the optical system of FIG. 8 is replaced by an optical lens and showing, at a lower portion thereof, phase diagrams at different positions along the geometrical light paths;

FIG. 14b is a sectional view taken along line A—A of FIG. 14a;

FIG. 15b is a view as viewed in the direction indicated by arrow marks B—B of FIG. 15a;

FIG. 16 is a schematic view showing an exemplary one of conventional converged ion beam apparatus;

DETAILED DESCRIPTION OF THE PREFERRED EMBODIMENTS

Figure 1:
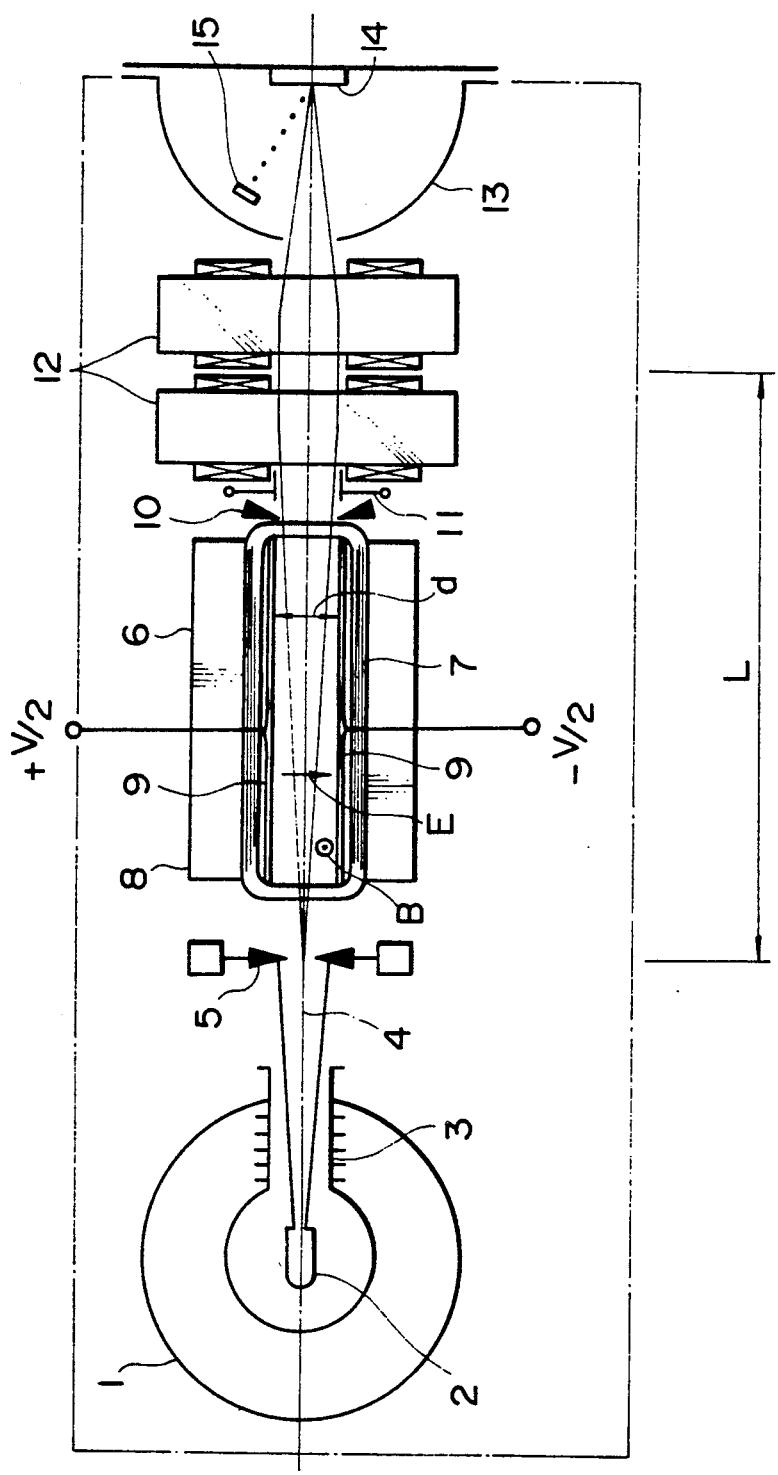
FIG. 1 is a schematic view of a converged ion beam apparatus to which the present invention is applied.

Referring first to FIG. 1, there is shown a converged ion beam apparatus to which the present invention is applied. The converged ion beam apparatus shown is formed as an analyzing apparatus and includes an accelerator 1 of the electrostatic type wherein, for example, helium gas is used as an ion source 2 from which ions including He$^+$ and He$^{2+}$ ions are produced. When an accelerating voltage of, for example, 1 MV is applied to an accelerator tube 3 of the accelerator 1, then a high energy ion beam 4 having energy of 1 MeV is produced from He$^+$ ions while a high energy ion beam 4 having energy of 2 MeV is produced from He$^{2+}$ ions. The high energy ion beams 4 produced in this manner come out at a high speed with high energy from the accelerator 1. The high energy ion beams 4 are supplied directly to an objective collimator 5 and restricted to a diameter of ten and several $\mu$m. After then, the high energy ion beams 4 enter a mass spectrograph 6 of the Wien (E×B) type serving as an analyzing component for analyzing the type of ions and energy of the ion beams. In the Wien (E×B) type mass spectrograph 6, a magnetic field B is produced by an electromagnet coil 7 and a window type electromagnet yoke 8 while an electric field E is produced in a spacing of an electrode distance d by applying voltages +V/2 and −V/2 to a pair of analyzing electrodes 9 on a side wall of the Wien (E×B) type mass spectrograph 6. On the condition that the ratio between the magnetic field B and the electric field E is an appropriate value, only He+ ions advance straightforwardly. On the other hand, the other ions are deflected, and consequently, they subsequently collide with an analyzing electrode 9 or an ion classifying slit device 10 on the exit side, neutralized in charge and discharged as exhaust gas. Thus, only the He+ ions which advance straightforwardly are subsequently introduced into and converged by a series of two quadruple pole magnetic lenses 12 and then introduced to a target (speciment to be measured) 14 in a specimen chamber 13 to form a beam spot on the target 14. Ions scattered or a fluorescent X-ray excited by mutual action of He+ ions with the specimen 14 to be measured is analyzed in energy by a detector 15 in the chamber 13 so that physical property data of the specimen 14 can be obtained. The position of the beam spot to be formed on the specimen 14 can be controlled to make a scanning operation by applying a voltage to a deflecting electrode 11 between the ion classifying slit 10 and the quadruple pole magnetic lenses 12 so as to make a two-dimensional analysis possible.

While the apparatus of the present embodiment is described above, it will be supported by way of the following analysis and illustration that a Wien (E×B) type mass spectrograph can be adopted and is suitable as an analyzing device for analyzing the type of ions and energy of a beam which is installed between the objective collimator 5 and the quadruple pole magnetic lenses 12.

The Wien (E×B) type mass spectrograph 6 has such a structure that the electromagnets and the parallel electrodes are disposed so that a deflecting action of the magnetic field B (proportional to a momentum of ions) and a deflecting action of the electric field E (proportional to energy of ions) may act in opposite directions to each other, and thus acts as a filter through which only ions of a type upon which the deflecting actions of the magnetic field B and the electric field E act such that they may cancel each other can advance straightforwardly. An equation of motion of an ion beam in the E×B fields is given, where a deflection amount is represented by x and a direction in which the beam advances is represented by z, as $$m \cdot \frac{d^2x}{dt^2} = -e \cdot (E - vB)$$

$$\frac{dz}{dt} = v$$

where m is an ion mass (m He=4×1.67×10$^{-27}$ kg in the case of He), e is ion charge (e He+ = 1.6×10$^{-19}$ C coulomb in the case of He+, v is an ion velocity = (2 eVo/m)$^{\frac{1}{2}}$, and Vo is an accelerating voltage.

Now, if the overall length of the analyzer 6 is represented by L and a deflection amount Δx when an ion comes out of the analyzer 6 is obtained by solving the equation given above, then the following expression is obtained. Here, an approximation is made as Δx<<L.

$$\Delta x = -\frac{L^2}{4Vo} \{E - (2 eVo/m)^{\frac{1}{2}} B\}$$

For example, a requirement of Δx=0 at which an ion advances straightforwardly is given by $$E = \left(\frac{2eVo}{m}\right)^{\frac{1}{2}} B \simeq 6.9 \times 10^6 B$$

Here, the unit of magnetic flux density of the magnetic field B is Tesla, and 1 Tesla=10$^4$ Gauss. Meanwhile, the unit of intensity of the electric field E is V/m, and 1 V/m=10$^{-2}$ V/cm.

Figure 2:
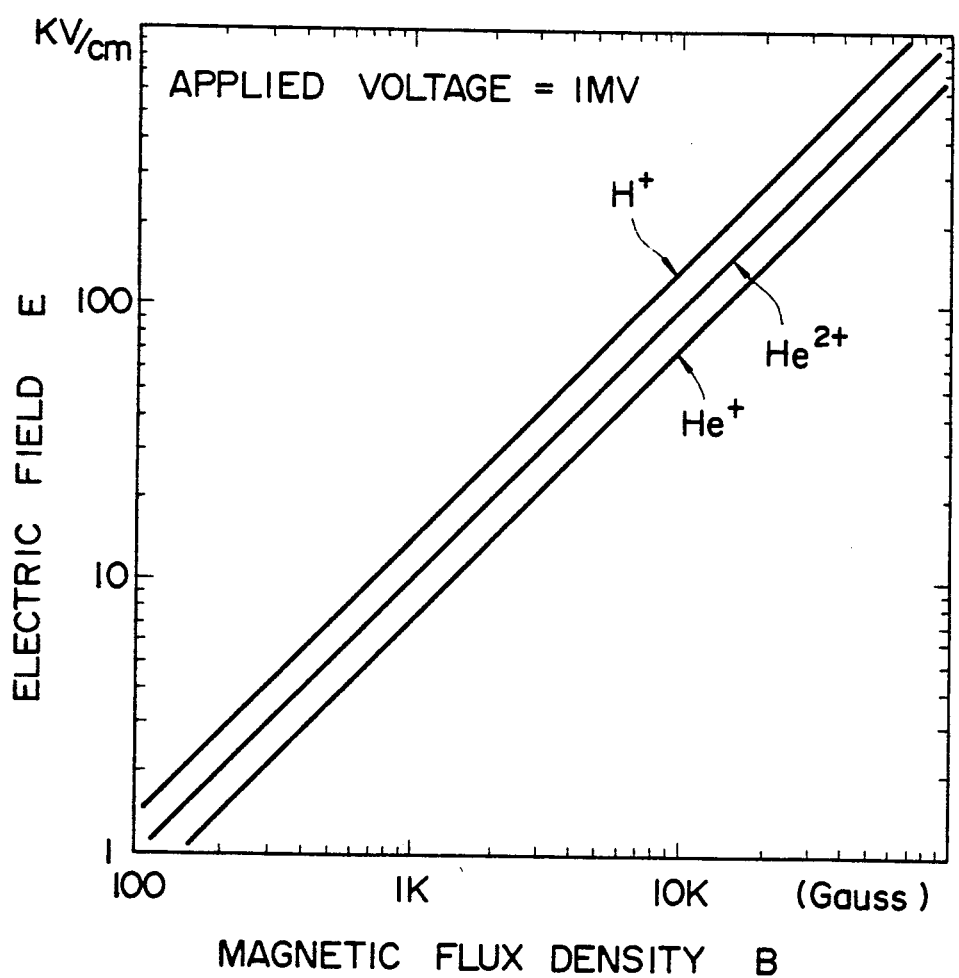
FIG. 2 is a diagram illustrating a relation between a magnetic flux density (Gauss) and an intensity of an electric field (V/cm) when various ion beams are conditioned for straightforward advancement in a Wien (E×B) type mass spectrograph of the converged ion beam apparatus of FIG. 1.

Such a relationship between the magnetic field B and the electric field E is illustrated in FIG. 2 in which they are represented in the units of Gauss and V/cm, respectively.

If deflection amounts Δx (unit: m) of He+ and He$^{2+}$ in a condition that L=2 m are sought as a relationship thereof to a magnetic field B (unit: Tesla), then the following results are obtained.

For He+, Δx≃6.9 B

For He$^{2+}$, Δx≃2.8 B

Now, if such requirements are assigned that the diameter of a bore of a quadruple pole magnetic lens of the type mentioned is 5 mm or so and He$^{2+}$ ions are deflected so that they may be spaced by a distance equal to ten times the dimension or so, then it can be seen from FIG. 2 that 180 Gauss is required for the magnetic field B and about 1,230 V/cm is required for the electric field E. Since those values can be obtained readily with a normal arrangement of electromagnetic and electric fields, a Wien (E×B) type mass spectrograph can be adopted for this purpose and is suitable.

Figure 3:
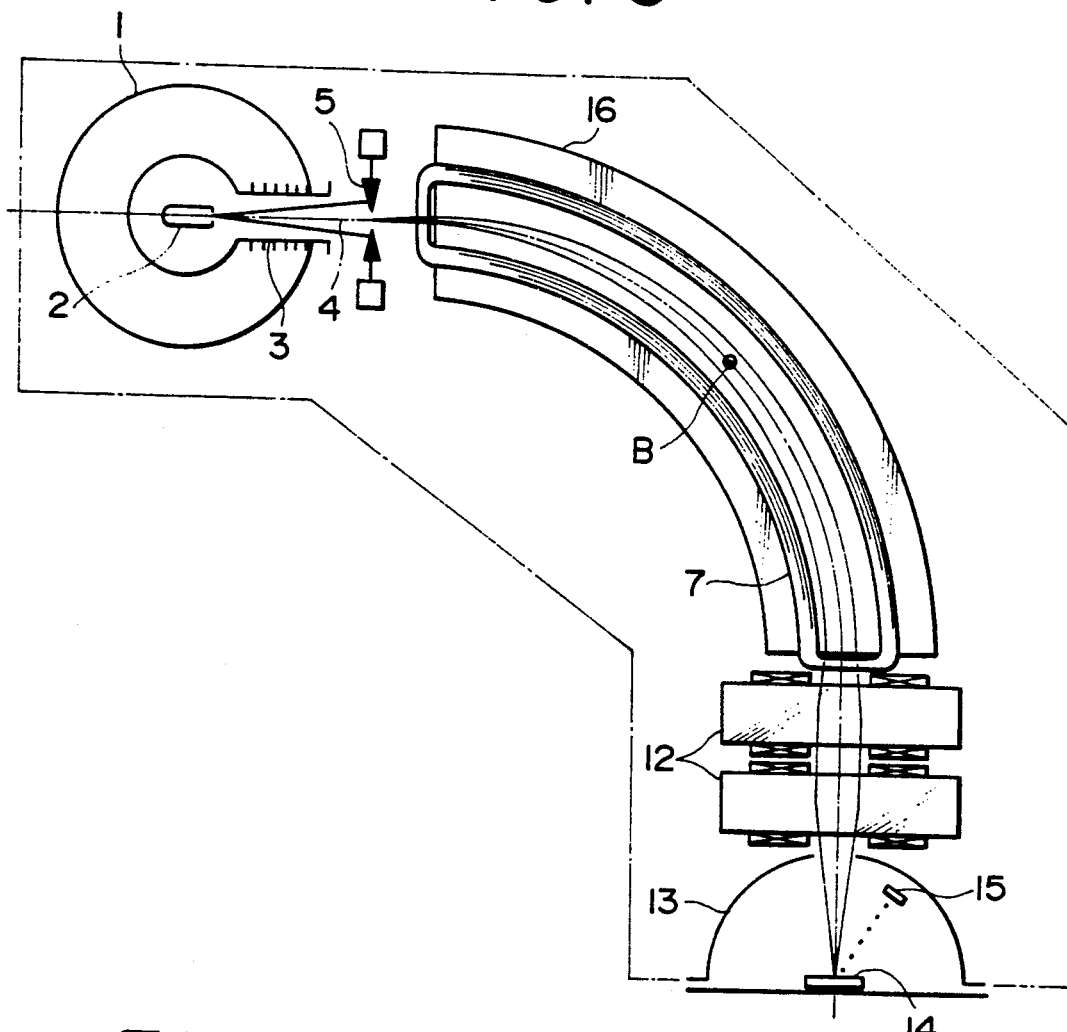
FIG. 3 is a schematic view of another converged ion beam apparatus to which the present invention is applied.

Referring now to FIG. 3, there is shown another converged ion beam apparatus to which the present invention is applied. Like parts are denoted by like reference numerals to those of FIG. 1, and overlapping description thereof is omitted herein to avoid redundancy.

The converged ion beam apparatus has a basically similar construction to that of the converged ion beam apparatus shown in FIG. 1 and is only different in that, in place of the Wien (E×B) type mass spectrograph 6, ion classifying slit device 10 and deflecting electrode 11 of the converged ion beam apparatus shown in FIG. 1, a 90 degree deflecting electromagnet 16 for deflecting a high energy ion beam by an angle of 90 degrees is installed as an analyzing component for analyzing the type of ions and energy of an ion beam between an objective collimator 5 and quadruple pole magnetic lenses 12. The deflecting angle of the deflecting electromagnet 16 may be selected within the range of 45 degrees to 180 degrees. A deflecting electrode may be used in place of such deflecting electromagnet 16.

It is to be noted that, while the converged ion beam apparatus shown in FIGS. 1 and 3 are each used as an analyzing apparatus, the hardware constructions of them allow each to be used as an ion implanting apparatus. However, where either of the apparatus is used as such, the detector 15 may be omitted.

Each of the quadruple pole magnetic lenses 12 employed in the converged ion beam apparatus shown in FIGS. 1 and 3 may be produced in the following manner in accordance with the present invention.

Figure 4:
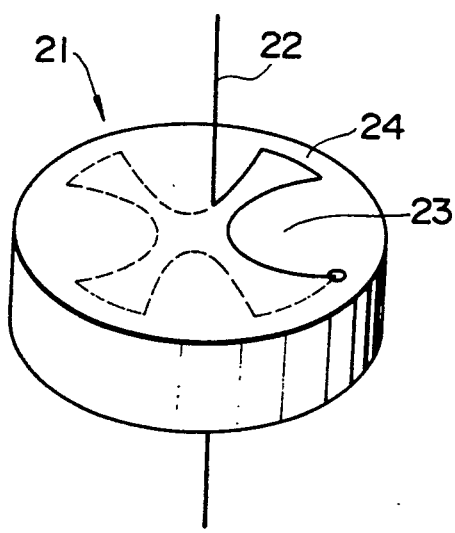
FIG. 4 is a perspective view showing a cylindrical magnetic material being electric discharge machined using a wire electrode to make a magnetic lens shown in FIG. 1.

In particular, a raw material of a ferromagnetic metal such as pure iron, a cobalt alloy or a vanadium-permendur alloy is first prepared. The raw material is worked to produce a cylindrical magnetic material which has a same thickness or axial length and a same diameter as those of a magnetic pole body to be produced. Such cylindrical magnetic material is shown in FIG. 4 and generally denoted at 21. The cylindrical magnetic material 21 is then electric discharge machined using a wire electrode 22 to scoop out a portion thereof in such a manner as seen in FIG. 4 to form a coil winding spacing while leaving a finishing allowance of about 1 mm. Consequently, such a preformed article as seen from FIG. 4 is obtained wherein four magnetic pole portions 23 and a return yoke portion 24 are formed as a unitary member.

Subsequently, heat treatment (annealing) of the magnetic substance is performed for the preformed article in order to remove general residual stress. After that portions of the preformed article other than the magnetic pole portions are finished, and finally, the wire electrode or the magnetic pole body is NC position controlled to move relative to each other to finish the end of each of the magnetic pole portions into a hyperbolic shape, thereby completing the magnetic pole body as a unitary member.

Coil bobbins of an insulator are subsequently mounted at roots of the magnetic pole portions of the magnetic pole body of the unitary type yoke, and coil windings are provided on the coil bobbins, thereby making a completed high precision quadruple pole magnetic lens.

Figure 5:
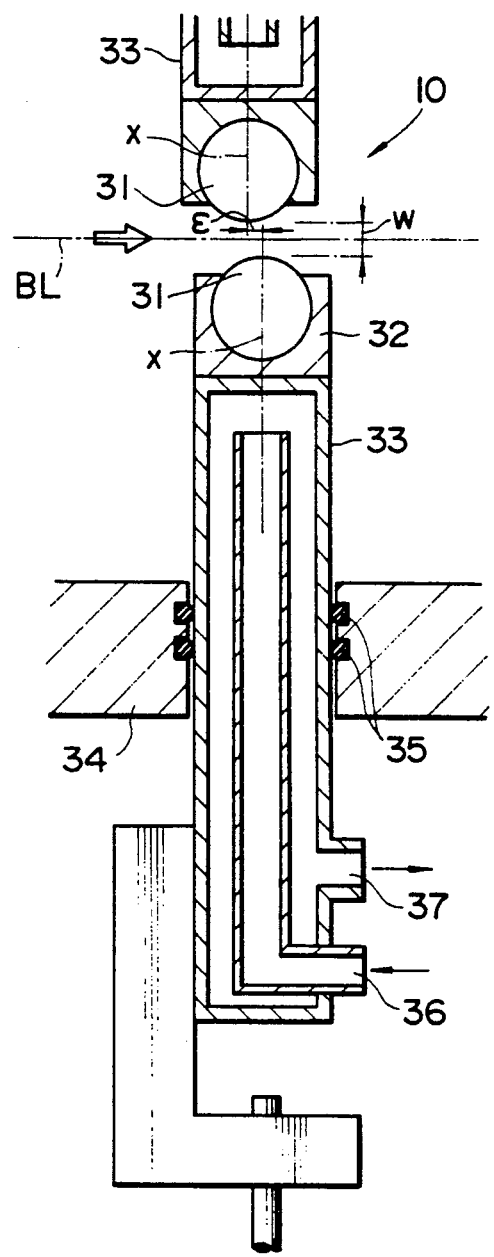
FIG. 5 is a vertical sectional side elevational view showing a slit device shown in FIG. 1.

Meanwhile, the slit device 10 described above is constructed in the following manner in accordance with the present invention. Referring to FIG. 5, the slit device 10 includes a pair of upper and lower cylindrical edge members 31 disposed in an upward and downward opposing relationship so as to define therebetween a slit gap of an opening width w across a charged particle beam line BL along which a high energy ion beam passes. The upper and lower cylindrical edge members 31 are disposed such that each of them may be translated in a direction toward a center axial line x thereof perpendicular to the beam line BL. In the arrangement shown, the center axial lines x of the edge members 31 are arranged such that they are displaced from each other by a small displacement distance $\epsilon$, for example, by 1 mm, along the beam line BL.

Each of the cylindrical edge members 31 is made of a heavy metal such as, for example, molybdenum so that it may not readily suffer from damage by irradiation of ions and may provide minimized forward scattering. Further, each cylindrical edge member 31 is held on an edge holding metal piece 32 made of a metal having a low heat conduction such as, for example, copper and mounted at an end of a post-like arm member 33 or of a post member extending along the direction of the center axial line x. The arm member 33 has a duplex pipe structure made of stainless steel and extends laterally through a vacuum duct wall 34. A pair of O-snap rings 35 are interposed between the arm member 33 and the vacuum duct wall 34 to seal the latter and guide the arm member 33 for advancing and retracting movement therein. The arm member 33 has a cooling water path mechanism formed therein which is communicated on the atmospheric air side thereof with a cooling water entrance 36 and a cooling water exit 37 such that cooling water flowing in from the entrance 36 may flow forwardly toward the holding metal piece 32 in the inner pipe and then flow reversely in the outer pipe whereafter it flows out from the exit 37 so that it may be circulated again. In this manner, the arm member 33 is not provided with a temperature gradient over the entire length thereof, and the amount of heat received at the edge member 31 from an ion beam is discharged efficiently, and a change in length by expansion does not take place.

Figure 7:
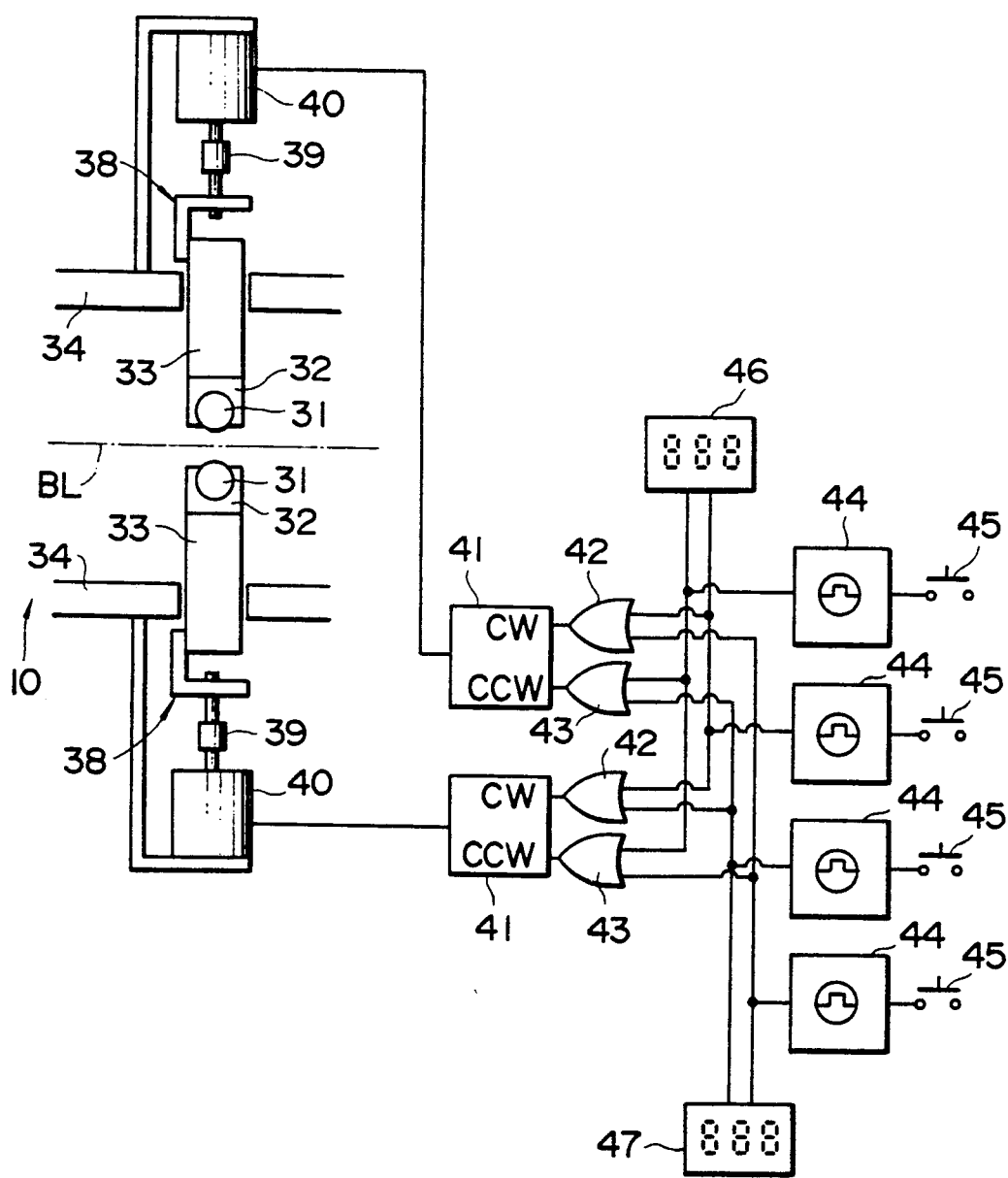
FIG. 7 is a wiring diagram of a controlling system for the slit device of FIG. 5.

Referring to FIG. 7, the arm members 33 are each connected on the atmospheric air side thereof to and driven by a stepping motor 40 by way of a rotation to translation converting mechanism 38 such as a ball screw mechanism and a coupling 39. Those elements 38, 39 and 40 constitute a precision driving mechanism section. When either of the stepping motors 40 rotates in one direction, the edge member 31 connected thereto is advanced toward the beam line BL, but it is retracted in the opposite direction by reverse rotation of the stepping motor 40 in the opposite direction.

Figure 6:
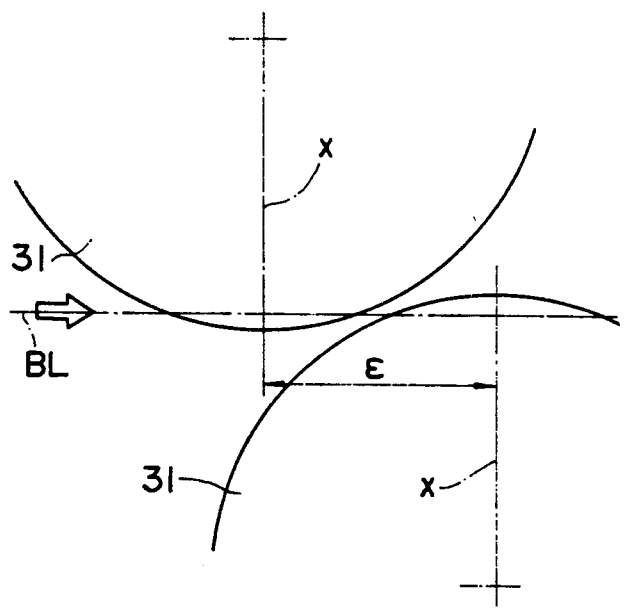
FIG. 6 is an enlarged vertical sectional side elevational view of edge members of the slit device of FIG. 5 in a completed closed condition.

In the slit device 10 shown in FIGS. 5 and 7, since one of the edge members 31 is displaced by the distance $\epsilon$ from the opposing edge member 31 as described hereinabove, the edge members 31 can advance to approach each other until they pass the beam line BL and come to a position in which they are overlapped with each other along the beam line BL, as is particularly seen in FIG. 6. In this position, the edge members do not collide in a solid contact condition with each other, and consequently, perfect interception of an ion beam can be realized. Accordingly, the position of the center of the opening of the slit can be determined readily.

Referring again to FIG. 7, there is shown a controlling system for the precision driving mechanism sections described above. The controlling system includes a pair of drivers 41 individually connected to the stepping motors 40. The drivers 41 are connected to four pulse generators 44 by way of OR elements 42 for the forward rotation and OR elements 43 for the reverse rotation, and each of the pulse generators 44 is connected in a compatible condition to an individual operating switch 15 such that it may have a function of increasing or decreasing the opening width of the slit or moving the opening center of the slit upwardly or downwardly. Signals of the pulse generators 44 are also coupled to an opening width indicating counter 46 and an opening center indicating counter 47 so that values of them may be indicated.

With the controlling system, adjustment and setting of the slit can be operated readily by depressing one of the four switches 45. For example, if the first opening width switch 45 from above in FIG. 7 is depressed, then pulses from one of the pulse generators 44 connected to the switch 45 are received at reverse input terminals ccw of the motor drivers 41 for the up/down movement by way of the OR elements 43 for the reverse rotation. Consequently, the stepping motors 40 are rotated reversely in a stepwise condition so that the edge members 31 are retracted from each other to increase the opening width of the slit while maintaining the opening center as it is. If the second switch 45 from above in FIG. 7 for increasing the opening width is depressed in a similar manner, then the stepping motors 40 are both rotated forwardly so that the edge members 31 are advanced toward each other to reduce the opening width of the slit while maintaining the opening center as it is. If the third switch 45 for raising the opening center is depressed, then the upwardly moving stepping motor 40 shown at a lower location in FIG. 7 is rotated reversely to raise the associated edge member 31 while the other downwardly moving stepping motor 40 is rotated forwardly to raise the associated edge member 31 so that the opening center of the slit is moved upwardly while maintaining the opening width of the slit between the edge members 31 as it is. If the fourth switch 45 for lowering the opening center is depressed, then the lifting stepping motor 40 is rotated forwardly to lower the associated edge member 31 while the lowering stepping motor 40 is rotated reversely to lower the associated edge member 31 so that the opening center of the slit is moved downwardly while maintaining the opening width of the slit between the edge member 31 as it is. Those operations do not require alternate operations of the upper and lower driving sections but may be made in an interlocking relationship in response to an operation of a single operating switch.

Referring now to FIG. 8, there is shown an optical system of a parallel charge beam forming lens arrangement which can be suitably incorporated in the converted ion beam apparatus shown in FIG. 1 or 3. The optical system shown includes an objective slit device or objective collimator 53 defining a slit having a diameter of 1 mm or so for cutting a beam 52 of protons or helium ions which is generated by an accelerator (not shown) of several MeV of the Van de Graaff type or the like in a vacuum condition of a vacuum tank 51 including a specimen chamber 54. The beam 52 cut by the slit device 53 then passes through a beam duct 60 and is then introduced into and converged by quadruple pole magnetic lenses 61 and 62 in doublet, whereafter it is irradiated upon a specimen 56 of a single crystal mounted on a biaxial goniometer 55 and disposed in the specimen chamber 54.

The quadruple pole magnetic lenses 61 and 62 are nonaxisymmetric lenses having such structures as shown in FIGS. 9a and 9b, respectively, and while each of them presents by itself a converging action in one direction but a diverging action in the other direction, where the two such lenses 61 and 62 having different polarities are combined in doublet and excited at a suitable intensity, a coverging action can be provided in both of two directions perpendicular to the common axis of them.

Referring now to FIG. 10 in an upper portion of which a collimation performance of the optical system including the slit 53 and the doublet quadruple pole magnetic lenses 61 and 62 are shown substituted by an optical lens system for the simplification of illustration, the opening width of the slit of the slit device 53 in the parallel charge beam forming lens arrangement described above, that is, an aperture d, is set such that it may be smaller than a product of a maximum spread angle $\beta$ of an incident beam and a distance L between the slit device 53 and the magnetic lenses 61 and 62 while the focal length f of the magnetic lenses 61 and 62 is set substantially equal to the distance L between the slit device 53 and the magnetic lenses 61 and 62.

Figure 18:
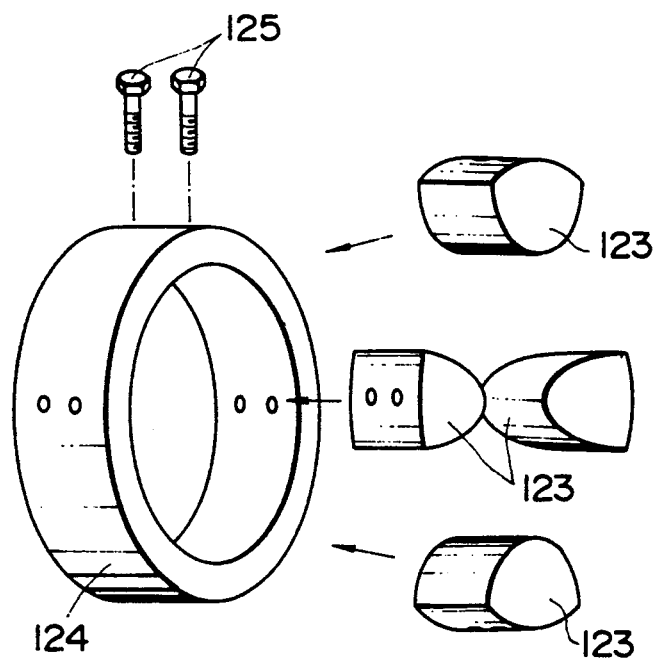
FIG. 18 is a fragmentary perspective view of the quadruple pole lens of FIG. 18.
Figure 19A:
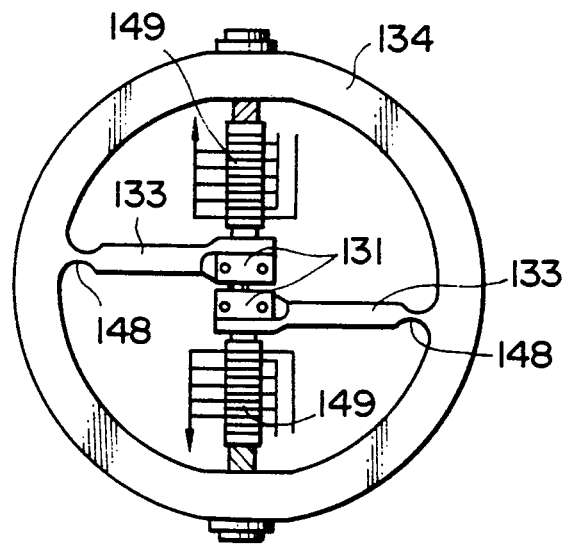
FIG. 19a is a front elevational view showing a conventional slit device for use with a converged ion beam apparatus and FIG. 19b is an enlarged partial vertical sectional side elevational view of a modified slit device.
Figure 19B:
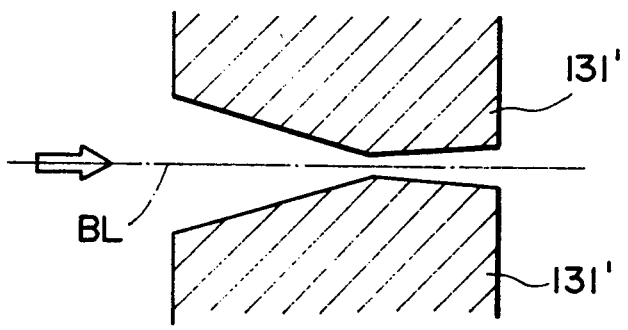
Figure 20:
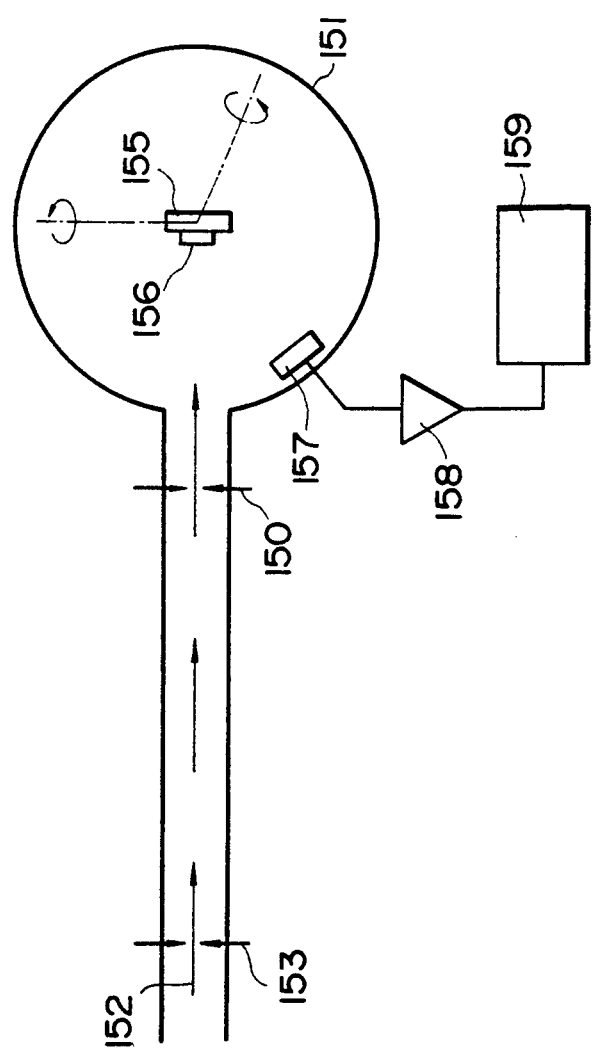
FIG. 20 is a diagrammatic vertical sectional side elevational view showing an optical system of a conventional double slit system.
Figure 21:
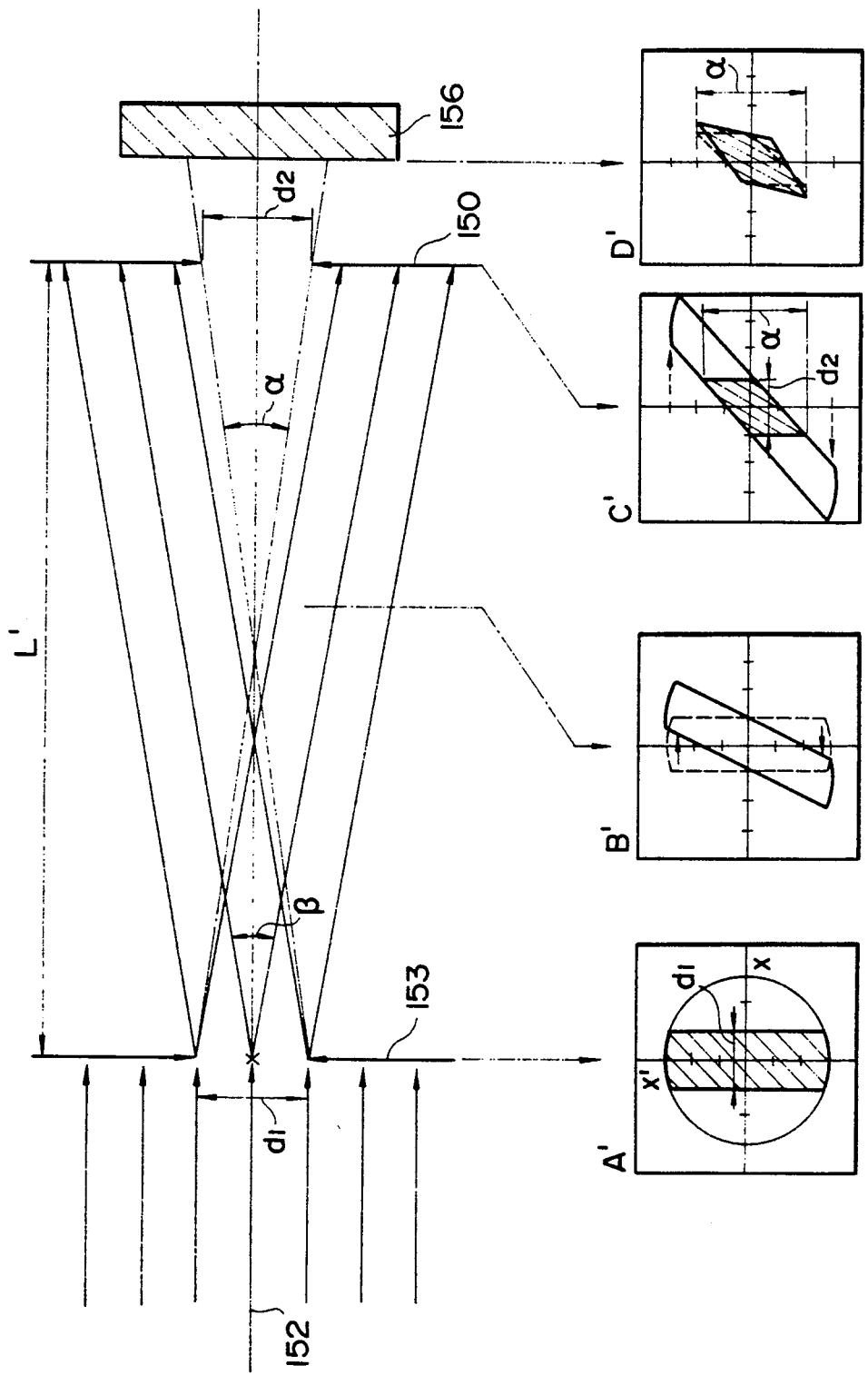
FIG. 21 is a diagrammatic representation showing, at an upper portion thereof, geometrical light paths of the optical system of FIG. 20 and showing, at a lower portion thereof, phase diagrams at different positions along the geometrical light paths.
Figure 22:
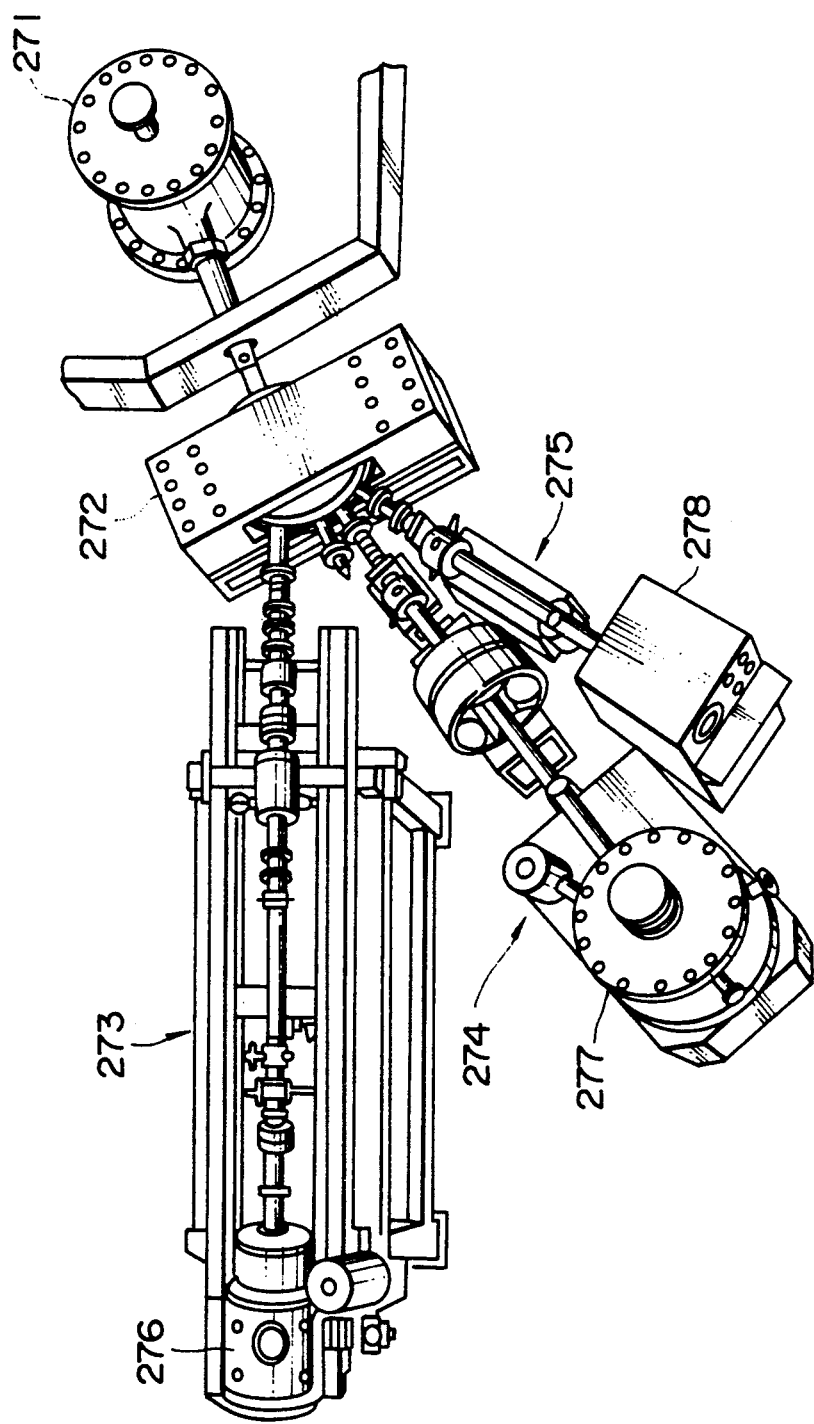
FIG. 22 is a perspective view showing a conventional multipurpose ion analyzing equipment.

Referring back to FIG. 8, ions irradiated upon and backscattered from the specimen 56 in this manner are normally detected by an annular detector 63 of the silicon surface barrier type (semiconductor) or a coin type detector 57. Such a detection signal is amplified by an amplifier (not shown) outside the vacuum tank 51 and then analyzed in energy by a multichannel type pulse-height analyzer (not shown) in a similar manner as in the conventional parallel charge beam forming lens arrangement described hereinabove with reference to FIGS. 18 and 19.

A collimation performance of the parallel charge beam forming lens arrangement shown in FIG. 8 will now be described subsequently using the optical lens system shown at the upper portion of FIG. 10. Such paths of rays of light as shown in FIG. 10 can be drawn in accordance with the geometrical optics. Here, such following parameters are defined.

$\alpha$: maximum spread angle (divergence angle) of a beam irradiated upon a surface of a specimen $\beta$: maximum spread angle (divergence angle) of an incident beam d: opening width of the slit 53

L: distance between the slit 53 and magnetic lenses 61 and 62 f: focal length of the magnetic lenses 61 and 62

As described hereinabove, since the lens focal length f and the slit-lens distance L are set equal to each other, L=f.

The spread angle $\alpha$ of an ion beam to be irradiated upon a surface of a specimen 56 by way of the optical system is given by the following expression from the light paths wherein parallel beams coming out of the slit opening are focused at a focus position 64 of the lenses 61 and 62 on the specimen side.

$$\alpha = d/f = d/L$$

From this expression, a relationship in magnitude between the spread angle $\beta$ of an incident beam and the spread angle $\alpha$ of a specimen irradiating beam can be led out.

Where $L\beta > d$ as in the present parallel charge beam forming lens arrangement, $\alpha < \beta$, and the parallelism is improved. Where $L\beta < d$ as different from the present parallel charge beam forming lens arrangement, $\alpha > \beta$, and accordingly, the parallelism is deteriorated.

It can be recognized from this that, in order for the optical system to operate as a parallel beam forming optical system, it is necessary to select suitable L and d in accordance with the magnitude of $\beta$ as in the present parallel charge beam forming lens arrangement. It can also be recognized that the spread angle $\alpha$ can be set arbitrarily only by adjustment of the opening width d of the slit of the slit device 53.

A most significant feature of the optical system of the parallel charge beam forming lens arrangement is that ions after having been restricted by the slit are conveyed and irradiated by 100% upon a specimen independently of a magnitude of $\beta$. This provides, where an ion source which is high in $\beta$ and is not high in quality is used, a remarkably high ion current in the same condition comparing with the double slit system of the prior art described hereinabove. Thus, the slit opening width can be reduced as much to further raise the parallelism of irradiating ions. Or else, the beam line can be made shorter.

Particularly, if ordinary values d=1 mm and L=3 m are substituted into the expression given hereinabove, then $\alpha = 0.7$ mrad (0.04 degrees) is obtained.

Manners of operation of the slit device 53 and magnetic lenses 61 and 62 in a phase space in the parallel charge beam forming lens arrangement are represented as in phase views A to E shown at a lower portion of FIG. 10.

If it is assumed that an incident beam has a circular emittance in a phase space, it is first cut out into a vertically elongated paper tablet shape by the slit 53 (view A). Then, as the incident beam advances in the drift space of the length L, it is deformed in accordance with conversions of $x \rightarrow x + x'L$ and $x' \rightarrow x'$ so that it presents such a shape as shown in the view B of FIG. 10 at a position immediately before the magnetic lenses 61 and 62. Then, while it passes through the magnetic lenses 61 and 62, it undergoes next conversions (approximation to a thin lens) $x \rightarrow x$ and $x' \rightarrow x' - x/f$ so that it is deformed as shown in the view C. Consequently, it is reduced in a vertical direction (while the area is fixed), and the parallelism is improved. After that, it travels in the drift space to a surface of a specimen 56 and undergoes the same deformation as described above so that it presents such a shape as shown in the view D and is irradiated upon the specimen. On the downstream of the lenses 61 and 62, at whichever position a specimen 56 is placed, the parallelism of the beam is constant. At the focus position 64 on the downstream of the lenses 61 and 62, the beam diameter presents a minimum value (crossover point).

Figure 11:
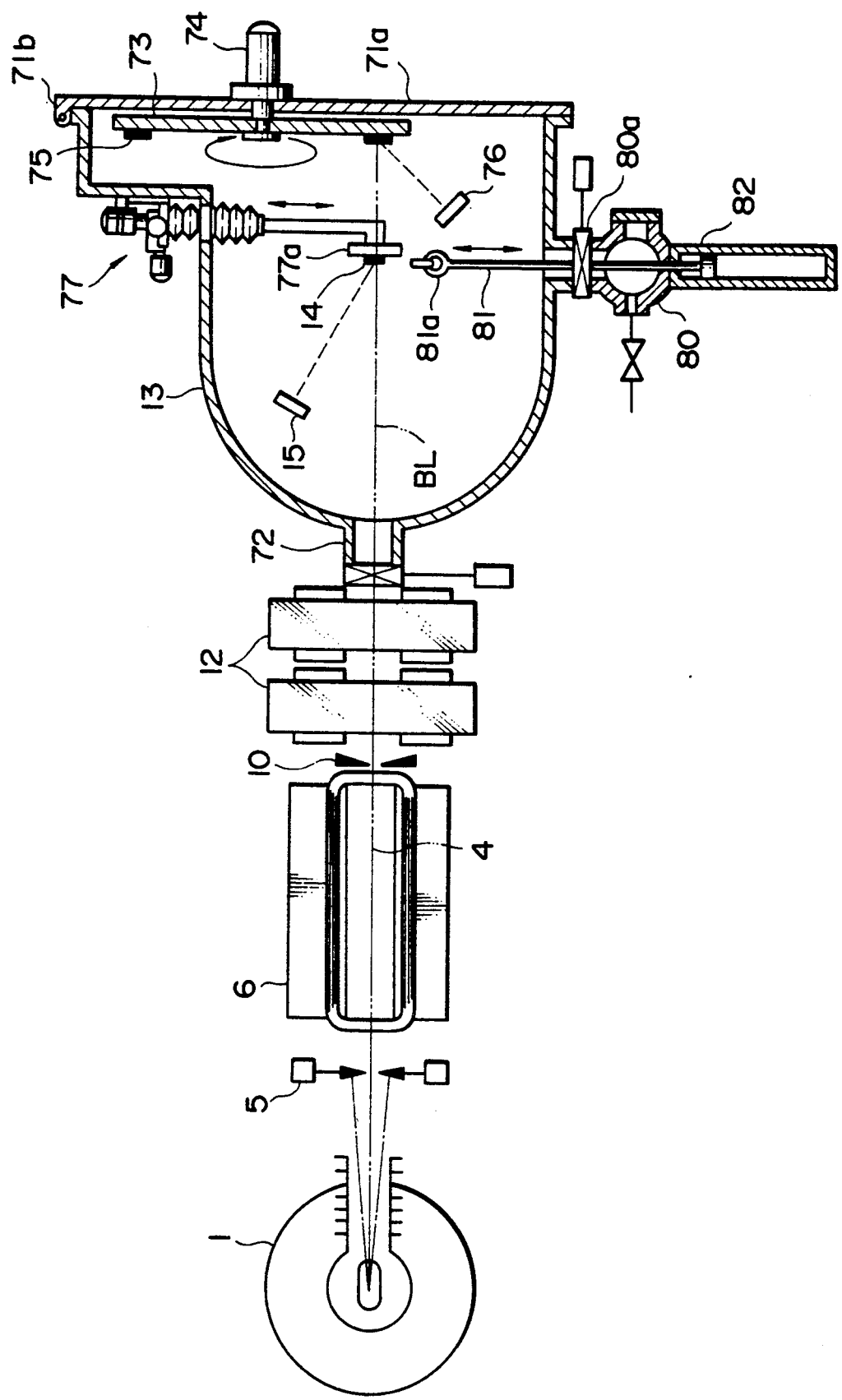
FIG. 11 is a horizontal sectional view of a converged ion beam apparatus in which a specimen chamber according to the present invention is incorporated.
Figure 12:
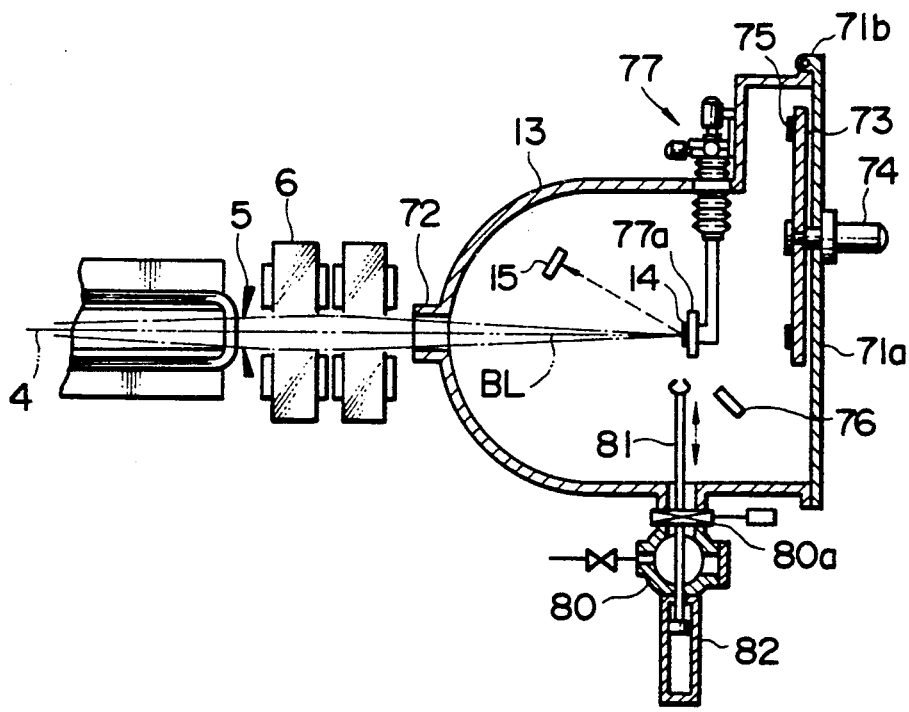
FIGS. 12 and 13 are similar views but illustrating different manners of operation of the specimen chamber of FIG. 11.
Figure 13:
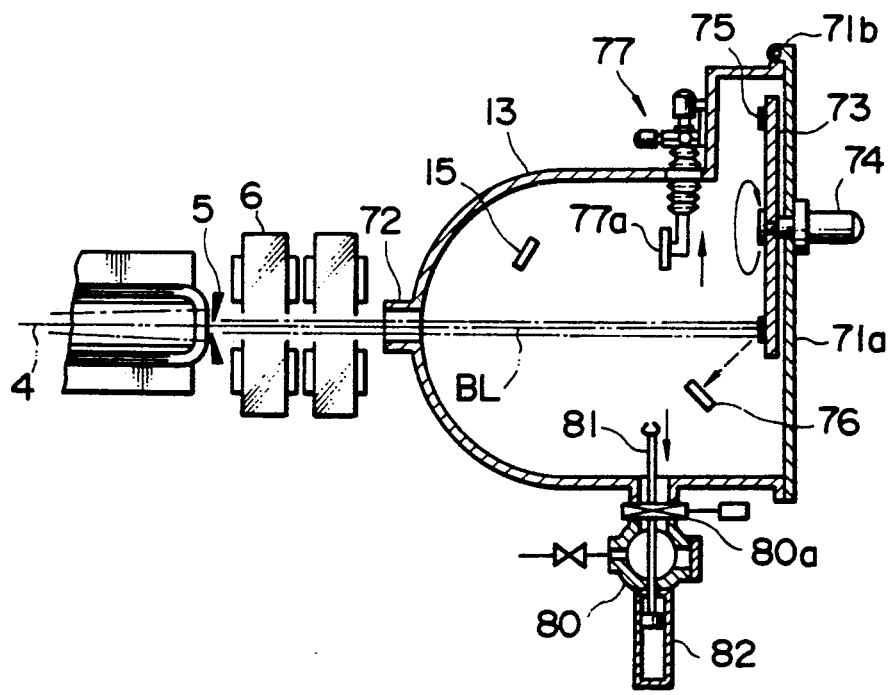

The specimen chamber 13 of the converged ion beam apparatus according to the present invention shown in FIG. 1 or 3 is shown more in detail in FIGS. 11 to 13. Referring first to FIG. 11, the specimen chamber 13 is formed as a vacuum pressure vessel and has a beam introducing port 72 provided at a front side wall thereof while an openable and closeable rear door 71a is mounted for pivotal motion at a rear portion of the specimen chamber 13 opposing to the beam introducing port 72 by way of a hinge 71b. The specimen chamber 13 is communicated with an air supplying/discharging device (not shown) by way of an air supplying/discharging pipe (not shown) so that the inside thereof may be deaerated to a predetermined degree of vacuum.

Meanwhile, the beam introducing port 72 is in the form of a cylinder which extends toward the incidence side of an ion beam 4 such that the ion beam 4 may be introduced into the specimen chamber 13 along an extension line of the center axial line of the cylinder 72, that is, a beam irradiation axial line BL indicated by an alternate long and two short dashes line in FIG. 11.

A multi-specimen carrying board 73 in the form of a disk of the turntable type is disposed on an inner face of the rear door 71a of the specimen chamber 13. The multi-specimen carrying board 73 has a rotary shaft supported for rotation on the rear door 71a by way of a vacuum seal bearing (not shown) and connected to a motor 74 mounted on an outer face of the rear door 71a so that it may be rotated by the motor 74. Meanwhile, the multi-specimen carrying board 73 has a large number of specimen holders provided at equal circumferential distances on a same pitch circle of an outer peripheral portion of a front face thereof such that it may carry a large number of specimens 75 to be analyzed with a large diameter ion beam and it may be rotated in a plane perpendicular to the beam irradiation axial line BL with a contact of the pitch circle thereof made coincident with the beam irradiation axial line BL.

Meanwhile, the motor 74 for rotating the multi-specimen carrying board 73 is controlled by a motor driver not shown such that the angular phase of rotation and stopping of an output power shaft thereof may be set and adjusted with a high degree of accuracy, and the motor 74 can thus position the individual specimens 75 carried on the multi-specimen carrying board 73 selectively or successively to a position on the beam irradiation axial line BL. Meanwhile, the rear door 71a can be opened together with the multi-specimen carrying board 73 and the motor 74 mounted thereon, and when the rear door 71a is open, loading and unloading of the specimens 75 onto or from the multi-specimen carrying board 73 can be performed readily outside the specimen chamber 13.

A detector 76 in the form of, for example, a detector of the coin type is disposed obliquely forwardly of the multi-specimen carrying board 73 such that a line interconnecting the detector 76 and a specimen 75 on the beam irradiation axial line BL may make a predetermined fixed angle with respect to the beam irradiation axial line BL. Thus, upon irradiation of a large diameter ion beam upon a specimen, the detector 76 detects scattered ions or a characteristic X-ray radiated from the specimen 75 and transmits the same as an electric signal to a measuring and analyzing device (not shown).

A goniometer 77 in the form of, for example, a goniometer of the precision three axis type for high vacuum which includes a vacuum, flange, extends through a side wall of the specimen chamber 13 located forwardly of the multi-specimen carrying board 73 and is mounted on the side wall of the specimen chamber 13 by way of the vacuum flange. The goniometer 77 extends in a direction perpendicular to the beam irradiation axial line BL with a driving portion thereof positioned outside the specimen chamber 13 and with a driven side specimen receiving portion 77a thereof positioned in the specimen chamber 13 such that a specimen 14 to be analyzed with a small diameter ion beam may be carried on the specimen receiving portion 77a of the goniometer 77 and may be positioned with a high degree of accuracy to a position at which a beam spot of a converged ion beam is focused on the beam irradiation axial line BL.

Further, the goniometer 77 is constituted such that the specimen receiving portion 77a thereof can be tilted in arbitrary directions of the three axes of X-Y-Z to incline the specimen 14 carried thereon to any orientation within the range of each 20 degrees with respect to the beam irradiation axial line BL and to move the specimen 14 away from the beam irradiation axial line BL. Further, a stepping motor (not shown) provided in the goniometer 77 for such movement is connected to a controlling device (not shown) provided for the converged ion beam apparatus described hereinabove.

A detector 15 in the form of, for example, a detector of the coin type is disposed obliquely forwardly of the specimen receiving portion 77a of the goniometer 77 such that a line interconnecting the detector 15 and the specimen receiving portion 77a makes a predetermined fixed angle with respect to the beam irradiation axial line BL. Thus, upon irradiation of a small diameter ion beam upon a specimen 14 on the specimen receiving portion 77a of the goniometer 77, the detector 15 detects scattered ions or a characteristic X-ray radiated from the specimen 14 and transmits the same as an electric signal to the converged ion beam apparatus described hereinabove.

A load locking specimen chamber 80 is disposed on the outside of a portion of the side wall of the specimen chamber 13 opposite to the location of the goniometer 77 and is communicated with the inside of the specimen chamber 13 by way of a communicating port in the side wall of the specimen chamber 13, and a gate valve 80a is provided in the communicating port. Meanwhile, the load locking chamber 80 is independently communicated with an air supplying/discharging device so that the inside thereof may be deaerated independently of the specimen chamber 13.

A manipulator 81 is disposed in the load locking chamber 80 and connected to be actuated by a cylinder mechanism 82 which is connected to the load locking chamber 80 so that a specimen gripping portion 81a at an end thereof on which a specimen can be carried may be moved back and forth between the inside of the load locking chamber 80 and the position on the specimen receiving portion 77a of the goniometer 77 to load or unload a specimen 14 onto or from the specimen receiving portion 77a of the goniometer 77. Thus, the specimen 14 on the specimen receiving portion 77a of the goniometer 77 can be replaced by way of the load locking chamber 80. Meanwhile, the cylinder mechanism 82 is constituted such that it may be controlled by the same controlling device as the gate valve 80a so that it may actuate the manipulator 81 only when the gate valve 80a is open.

The converged ion beam apparatus shown in FIG. 11 includes, in addition to the specimen chamber 13, an accelerator 1 of the electrostatic type, an objective collimator 5, a mass spectrograph 6 of the Wien (E×B) type, an ion classifying slit device 10, and a pair of quadruple pole magnetic lenses 12. All of these elements may be substantially similar to those of the converged ion beam apparatus shown in FIG. 1.

In the converged ion beam apparatus, ions generated from an ion source (not shown) in the electrostatic accelerator 1 and including, for example, He+ and He²+ ions are accelerated by an accelerator tube (not shown) and radiated as an ion beam of a high energy of several MeV. The ion beam is restricted to several tens μm directly by the objective collimator 5 and then introduced into the Wien (E×B) type mass spectrograph 6. Then, only He+ ions advance straightforwardly while ions of the other types collide with the ion classifying slit 10 and are neutralized in charge and removed by an action of an electric field produced in a fixed condition in the Wien (E×B) type mass spectrograph 6. Meanwhile, the He+ ion beam 4 advancing straightforwardly passes through the subsequent quadruple pole magnetic lenses 12 and is introduced into the specimen chamber 13 by way of the beam introducing port 72 along the beam irradiation axial line BL.

The ion beam 4 introduced into the specimen chamber 13 in this manner is one of several types of ion beams including an ion beam of a type which is obtained by restricting an incidence ion beam to a diameter of 0.1 mm to 1 mm or so by the ion classifying slit 10 without rendering the quadruple pole magnetic lenses 12 operative, an ion beam of another type which is obtained by restricting an incidence ion beam so as to form a beam spot of a diameter on the order of μm by rendering the quadruple pole magnetic lenses 12 operative, and a parallel ion beam of a further type which has a diameter on the order of mm and is formed by cooperation of the ion classifying slit 10 and the quadruple pole magnetic lenses 12.

Referring now to FIG. 12, when an analysis is to be made with the converged ion beam apparatus of FIG. 11 using a small diameter ion beam, an intended converged ion beam is formed by rendering the quadruple pole magnetic lenses 12 operative. The converged ion beam 4 obtained in this manner is introduced into the specimen chamber 13 by way of the beam introducing port 72 and is irradiated upon a specimen 14 carried on the specimen receiving portion 77a of the goniometer 77 and is positioned on the beam irradiation axial line BL in the specimen chamber 13. The converged ion beam 4 thus forms a beam spot on the specimen 14. Consequently, ions or an excited characteristic X-ray is radiated from the specimen 14 and detected by the detector 15 in the specimen chamber 13, and a type, energy, angle and so forth of the ions or excited characteristic X-ray is analyzed to obtain physical property data of the specimen 14.

In this instance, since the specimen 14 can be positioned with a high degree of accuracy at the position of a beam spot of the ion beam 4 by the goniometer 77, an analysis in accordance with the random RBS method or the PIXE method which uses a small diameter ion beam can be made with a high degree of accuracy. Further, since the specimen 14 on the specimen receiving portion 77a of the goniometer 77 can be replaced by way of the manipulator 81 while maintaining a degree of vacuum in the specimen chamber 13 by way of the load locking chamber 80, such analyses which use a small diameter ion beam can be made successively and efficiently.

On the other hand, when an analysis which uses a large diameter parallel ion beam is to be made, a parallel ion beam is formed by cooperation of the ion classifying slit 10 and the quadruple pole magnetic lenses 12. The parallel ion beam 4 produced in this manner is introduced into the specimen chamber 13 by way of the beam introducing port 72 and then to a specimen 14 carried on the specimen receiving portion 77a of the goniometer 77 positioned on the beam irradiation axial line BL in the specimen chamber 13 so that physical property data of the specimen 14 are obtained. However, since the specimen receiving portion 77a on which the specimen 14 is carried can be inclined in any orientation within the range of each 20 degrees with respect to the beam irradiation axial line BL to adjust the incidence angle of the parallel ion beam 4 with respect to the specimen 14, an analysis in accordance with the channeling RBS method wherein it is necessitated to cause a parallel ion beam to be introduced in parallel to a crystal axis of a specimen can be made accurately and efficiently.

An analysis using a large diameter ion beam can be made in a different manner with the converged ion beam apparatus of FIG. 11. Referring now to FIG. 13, an ion beam 4 which is restricted to a diameter of 0.1 mm to 1 mm or so by the ion classifying slit 10 is first produced and then introduced by way of the beam introducing port 72 into the specimen chamber 13 in which it is introduced along the beam irradiation axial line BL. In this instance, however, the specimen receiving portion 77a of the goniometer 77 and the manipulator 81 are held at individually retracted positions spaced away from the beam irradiation axial line BL. Accordingly, the ion beam 4 is formed into an ion beam of a diameter on the order of mm and introduced to that one of specimens 75 carried on the multi-specimen carrying board 73 which is positioned on the beam irradiation axial line BL. Consequently, ions or an excited X-ray is radiated from the specimen 75 and detected by the detector 76 in the specimen chamber 13, and a type, energy, angle and so forth of the same are analyzed to obtain physical property data of the specimen 75.

In this instance, since the ion beam 4 can be sequentially and successively irradiated upon a large number of specimens 75 carried on the multi-specimen carrying board 73, an analysis in accordance with the random RBS method or the PIXE method which uses a large diameter ion beam can be made efficiently.

Where the specimen chamber described above is employed, ion beams of various types having different characteristics including a small diameter beam, a large diameter beam and a parallel beam can be selectively used and introduced along the same beam irradiation axial line to make various analyses in the same chamber. Accordingly, the ion beam analyzing apparatus which employs the specimen chamber can cope with a multi-purpose analysis and besides can be made compact and inexpensive. Further, since the specimen chamber described above adopts such a construction that an analysis which uses a large diameter ion beam and accordingly does not require a comparatively high degree of accuracy in positioning of a specimen is made on the downstream side of an ion beam introduced into the specimen chamber so that a large number of specimens may be treated by one batch and loading and unloading of specimens can be performed efficiently while another analysis which uses a small diameter ion beam and accordingly requires a high degree of positioning accuracy is made on the upstream side on the same beam irradiation axial line so that an individual specimen can be positioned with a high degree of accuracy, the individual analyses can be made efficiently with a degree of reproducibility and accuracy conforming to the objects.

Figure 14A:
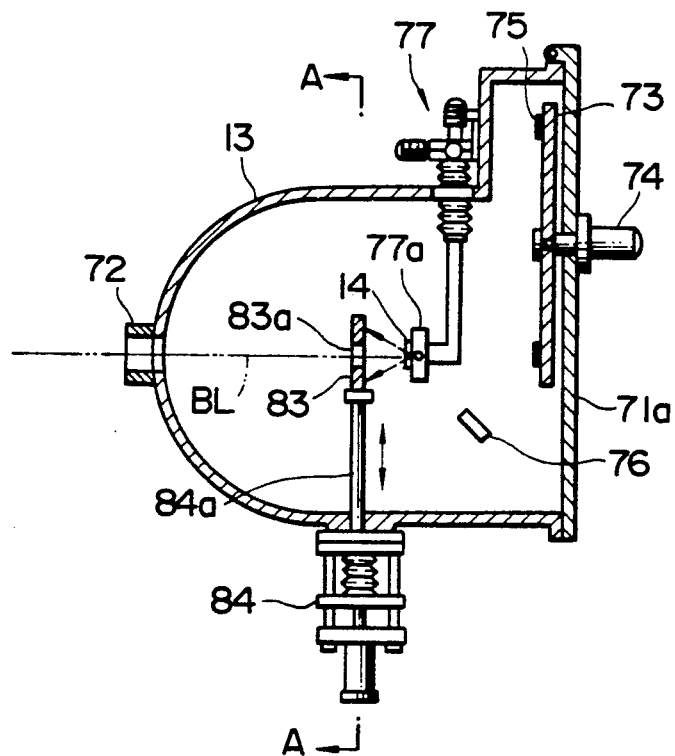
FIG. 14a is a similar view but showing a modified specimen chamber.
Figure 14B:
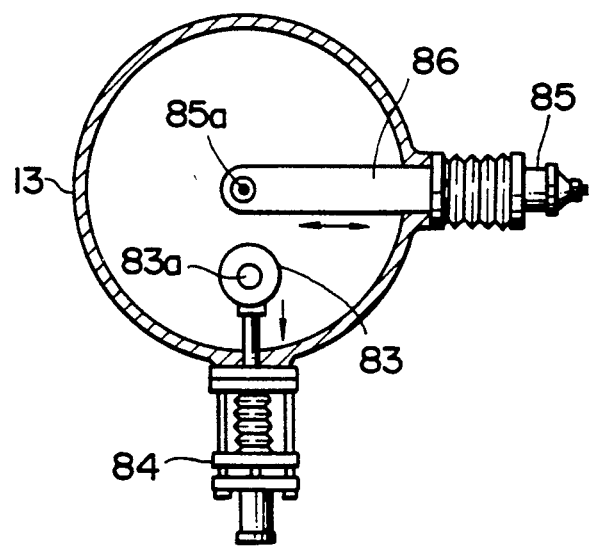

Referring now to FIGS. 14a and 14b, there is shown a modification to the specimen chamber shown in FIG. 11. The modified specimen chamber also denoted at 13 includes a detector 83 of the annular type disposed therein. The annular detector 83 has a center hole 83a formed therein and is mounted at an end of a piston rod 84a of a cylinder 84 which extends through a side wall of the specimen chamber 13. The cylinder 84 is mounted on an outer face of the side wall of the specimen chamber 13 by means of a vacuum flange such that it may be moved perpendicularly to a beam irradiation axial line BL to and from a predetermined position on the beam irradiation axial line BL which is spaced by a predetermined distance forwardly of a specimen receiving portion 77a of a goniometer 77. When an ion beam is introduced into the specimen chamber 13 by way of a beam introducing port 72 and along the beam irradiation axial line BL, it passes through the center hole 83a of the annular detector 83 and is irradiated upon a specimen 84 on the specimen receiving portion 77a of the goniometer 77. The annular detector 83 thus detects scattered ions or a characteristic X-ray radiated from the specimen 84 and transmits the same as an electric signal to the converged ion beam apparatus (not shown) in which the specimen chamber 13 is incorporated.

The specimen chamber 13 further includes an optical microscope 85 incorporated in a slide mechanism 86. The slide mechanism 86 extends through another portion of the side wall of the specimen chamber 13 which is displaced by an angle of about 90 degrees in phase from the location of the cylinder 84, as is particularly seen in FIG. 14b, and is mounted on the side wall of the specimen chamber 13 by way of a vacuum flange such that a lens 85a of the microscope 85 thereon may be moved to a position near a specimen 84 carried on the specimen receiving portion 77a of the goniometer 77 by operation of the slide mechanism 86 so that a surface of the specimen 84 may be observed from the outside of the specimen chamber 13. Further, when the lens 85a of the optical microscope 85 approaches the specimen 84, the annular detector 83 is retracted from the beam irradiation axial line BL as seen in FIG. 14b.

It is to be noted that, while an optical microscope is employed in the present arrangement, an electron microscope may be applied instead.

In the specimen chamber of the modification having such a construction as described above, since the annular detector 83 can take a large solid angle with respect to a specimen 84 carried on the specimen receiving portion 77a of the goniometer 77, ions radiated from the specimen 84 by irradiation of an ion beam can be detected with a high degree of accuracy and a measurement and an analysis of a higher degree can be made. In addition, since a surface of the specimen 84 after it has been irradiated with an ion beam can be observed directly by means of the optical microscope 85, the accuracy in measurement and analysis can be made surer.

It is to be noted that the load locking chamber 80 and the manipulator 81 of the specimen chamber 13 shown in FIG. 11 can naturally be provided in the modified specimen chamber shown in FIGS. 14a and 14b. In this instance, the goniometer 77, manipulator 81, annular detector 83 and optical microscope 85 should be disposed at locations of the side wall of the specimen chamber 13 displaced in angular phase from each other so that they may not interfere with each other during operation.

Figure 15A:
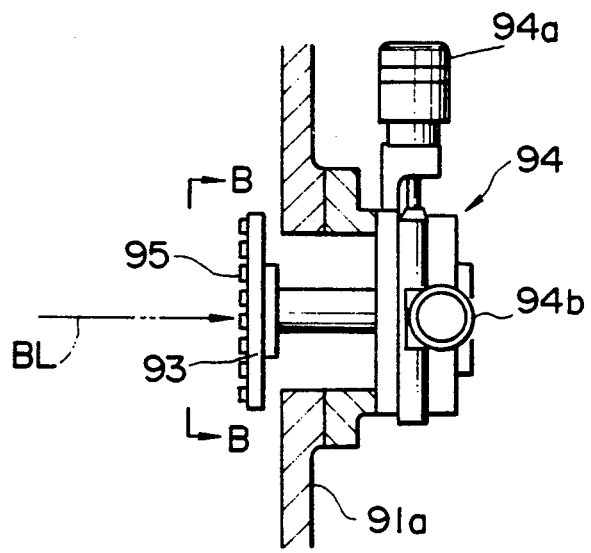
FIG. 15a is a partial sectional view of another modified specimen chamber.
Figure 15B:
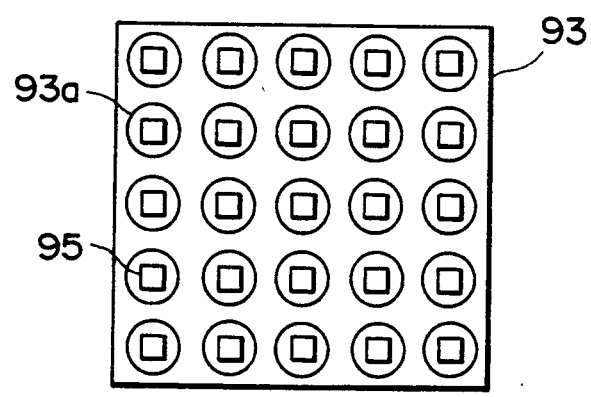
Figure 17:
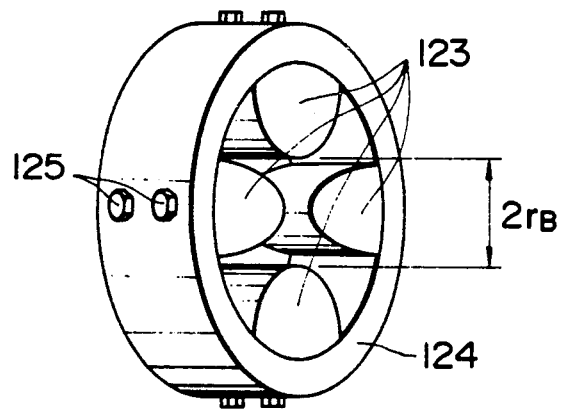
FIG. 17 is a perspective view showing a body of a conventional quadruple pole lens.

Further, while the specimen carrying board in either of the specimen chambers shown in FIG. 11 and in FIGS. 14a and 14b is in the form of a disk of the turntable type and is rotated by the motor to successively analyze a large number of specimens carried thereon, it may have some other form. For example, the specimen carrying board may have such a form as shown in FIGS. 15a and 15b. In particular, the multi-specimen carrying board denoted at 93 is in the form of a rectangular board mounted on a rear door 91a of a specimen chamber and is moved in an arbitrary one of X-Y directions not by a motor but by means of a high precision goniometer 94 including a computer-controlled X and Y moving devices 94a and 94b. In the case of the present arrangement, since a plurality of specimen holders 93a for holding specimens 95 thereon can be provided densely in such a checkered pattern as shown in FIG. 15b or otherwise in a zigzag pattern on the multi-specimen carrying board 93, the multi-specimen carrying board 93 and the specimen chamber 13 can be made in compact construction.

Having now fully described the invention, it will be apparent to one of ordinary skill in the art that many changes and modifications can be made thereto without departing from the spirit and scope of the invention as set forth herein.

What is claimed is:

1. A converged ion beam device for an apparatus wherein a high energy charge beam in the form of an ion beam from an accelerator is introduced in a spot to a specimen by way of an ion type classifying device, comprising an objective collimator and a beam collector to perform reforming of a surface or an analysis of physical properties and/or composition of a small area of the specimen, wherein said objective collimator is disposed just on the downstream of said accelerator, and an analyzing component for analyzing an ion type and/or energy of said ion beam is interposed in a drift space in an object distance between said objective collimator and a quadruple pole magnetic lens.

2. A converged ion beam device according to claim 1, wherein a mass spectrograph of the Wien (E×B) type is used as said analyzing component.

3. A converged ion beam device according to claim 1, wherein either one of a deflecting electromagnet and a deflecting electrode for deflecting a charge beam is used as said analyzing component.

4. A converged ion beam device according to any one of claims 1 to 3, wherein said quadruple pole magnetic lens includes a magnetic pole body comprised of four magnetic pole portions, and a return yoke portion disposed to surround an outer periphery of said magnetic pole portions in such a manner as to form a closed magnetic flux passage, said magnetic pole portions and said return yoke portion being formed as a unitary member by a scooping out operation from the same magnetic material of a unitary member.

5. A converged ion beam device according to claim 4, wherein the magnetic pole portions and said return yoke are formed by the scooping out operation which comprises applying a technique of electric discharge machining using a wire electrode to form a hyperbolic shape of said magnetic pole portions with a finishing tolerance on the order of $\mu m$.

6. A converged ion beam device according to any one of claims 1 to 3, further comprising an objective slit device positioned between said analyzing component and said quadruple magnetic lens wherein
   (I) said objective slit comprises a pair of slit defining members having wedge-shaped, knife-shaped or cylindrical edges disposed in an opposing relationship to each other to define a slit gap therebetween but displaced a little distance along a charge beam from each other;
   (II) said objective slit device further comprises a pair of precision driving mechanisms for individually precision driving said slit defining members, and a pair of arms and/or posts individually supporting said slit defining members thereon and individually coupling said slit defining members to said precision driving mechanisms and each having a cooling water path mechanism formed therein for introducing and passing cooling water therethrough to a location proximate to the edge of a corresponding one of said slit defining members; and
   (III) each of said precision driving mechanisms includes a stepping motor for driving a corresponding one of said slit defining members, and the stepping motors are controlled by an opening width controller for controlling a width of said slit gap and an opening center position controller for controlling the position of the center of said slit gap, each of said opening width controller and opening center position controller including a pulse generator.

7. A converged ion beam analyzing apparatus wherein a high energy charge beam from an accelerator is introduced in a spot to a specimen to be measured by way of an ion type classifying device, an objective collimator and a beam collector to perform an analysis of physical properties and/or composition of a small area of the specimen, characterized in that said objective collimator is disposed just on the downstream of said accelerator, and an analyzing component for analyzing an ion type and/or energy of a charge beam is interposed in a drift space in an object distance between said objective collimator and a quadruple pole magnetic lens.

8. A converged ion beam analyzing apparatus according to claim 7, further comprising a parallel charge beam forming lens device comprising an optical system
   I) which includes a single slit device and a magnetic lens disposed on the downstream of said slit device along a beam line, and
   II) wherein the opening width of a slit of said slit device is set to a value smaller than a product of a maximum spread angle of an incident beam and a distance between said slit device and said magnetic lens, and
   III) the focal length of said magnetic lens is set substantially equal to the distance between said slit device and said magnetic lens.

9. A converged ion beam analyzing apparatus according to claim 7, further comprising a specimen chamber containing said specimen comprising a multi-specimen positioning device disposed in said specimen chamber and having a beam admitting port for selectively admitting therethrough an ion beam having a large diameter or a small diameter along a common beam irradiation axial line, said multi-specimen positioning device being capable of carrying thereon a plurality of specimens to be analyzed by an ion beam of the large diameter and selectively positioning one of the specimens at a position on the beam irradiation axial line, and a goniometer disposed in said specimen chamber for movement to and from a position on the beam irradiation axial line between said multi-specimen positioning device and said beam admitting port and capable of carrying a specimen to be analyzed by an ion beam of the small diameter and positioning the specimen with a high degree of accuracy at a position on the beam irradiation axial line.

10. A converged ion beam device according to claim 9, wherein in said specimen chamber said annular type detector is provided for movement to and from a position on the beam irradiation axial line and has a detecting section of a microscope carried thereon, and that said specimen chamber further comprises a moving mechanism for moving said detecting section of said microscope to a specimen carried on said goniometer.

11. A converged ion beam device, comprising:
   an ion source;
   an accelerator for forming an ion beam from said ion source;
   an objective collimator positioned downstream of said accelerator for restricting the diameter of said ion beam;
   an analyzing means positioned downstream of said objective collimator for analyzing an ion type and/or energy of said ion beam;
   a quadruple pole magnetic lens positioned downstream of said analyzing means for focusing said ion beam onto a specimen; and
   a detector positioned proximate to said specimen for detecting physical properties of said specimen based on the reaction of said specimen to said ion beam striking said specimen.

12. A converged ion beam device according to claim 11, wherein a mass spectrograph of the Wien (E×B) type is used as said analyzing means.

13. A converged ion beam device according to claim 11, wherein either one of a deflecting electromagnet or a deflecting electrode for deflecting said ion beam is used as said analyzing means.

14. A converged ion beam device according to any one of claims 11 to 13, wherein said quadruple pole magnetic lens includes a magnetic pole body comprised of four magnetic pole portions, and a return yoke portion disposed to surround an outer periphery of said magnetic pole portions in such a manner as to form a closed magnetic flux passage, said magnetic pole portions and said return yoke portion being formed as a unitary member by a scooping out operation from the same magnetic material of a unitary member.

15. A converged ion beam device according to claim 14, wherein the magnetic pole portions and said return yoke are formed by the scooping out operation which comprises applying a technique of electric discharge machining using a wire electrode to form a hyperbolic shape of said magnetic pole portions with a finishing tolerance on the order of μm.

16. A converged ion beam device according to any one of claims 11 to 13, further comprising an objective slit device positioned between said analyzing means and said quadruple pole magnetic lens wherein
  (I) said objective slit device comprises a pair of slit defining members having wedge-shaped, knife-shaped or cylindrical edges disposed in an opposing relationship to each other to define a slit gap therebetween but displaced a little distance along a charge beam from each other;
  (II) said objective slit device further comprises a pair of precision driving mechanisms for individually precision driving said slit defining members, and a pair of arms and/or posts individually supporting said slit defining members thereon and individually coupling said slit defining members to said precision driving mechanisms and each having a cooling water path mechanism formed therein for introducing and passing cooling water therethrough to a location proximate to the edge of a corresponding one of said slit defining members; and
  (III) each of said precision driving mechanisms includes a stepping motor for driving a corresponding one of said slit defining members, and the stepping motors are controlled by an opening width controller for controlling a width of said slit gap and an opening center position controller for controlling the position of the center of said slit gap, each of said opening width controller and opening center position controller including a pulse generator.

17. A converged ion beam analyzing apparatus according to claim 11, further comprising a parallel ion beam forming lens comprising an optical system
  (I) which includes a single slit device and a magnetic lens disposed on the downstream of said slit device along a beam line, and
  (II) wherein the opening width of a slit of said slit device is set to a value smaller than a product of a maximum spread angle of an incident beam and a distance between said slit device and said magnetic lens, and
  (III) the focal length of said magnetic lens is set substantially equal to the distance between said slit device and said magnetic lens.

18. A converged ion beam analyzing apparatus according to claim 11, further comprising a specimen chamber containing said specimen and said detector characterized in that it comprises a multi-specimen positioning device disposed in said specimen chamber and having a beam admitting port for selectively admitting therethrough an ion beam having a large diameter or a small diameter along a common beam irradiation axial line, said multi-specimen positioning device being capable of carrying thereon a plurality of specimens to be analyzed by an ion beam of the large diameter and selectively positioning one of the speciments at a position on the beam irradiation axial line, and a goniometer disposed in said specimen chamber for movement to and from a position on the beam irradiation axial line between said multi-specimen positioning device and said beam admitting port and capable of carrying a specimen to be analyzed by an ion beam of the small diameter and positioning the specimen with a high degree of accuracy at a position on the beam irradiation axial line.

19. A converged ion beam device according to claim 18, wherein in said specimen chamber said annular type detector is provided for movement to and from a position on the beam irradiation axial line and has a detecting section of a microscope carried thereon, and that said specimen chamber further comprises a moving mechanism for moving said detecting section of said microscope to a specimen carried on said goniometer.

* * * * *